(12) United States Patent
Kuwahara

(10) Patent No.: US 11,127,613 B2
(45) Date of Patent: Sep. 21, 2021

(54) SUBSTRATE TREATING APPARATUS AND SUBSTRATE TRANSPORTING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd.

( * ) Notice: Subject to any disclaimer, the term of this patent is extended or adjusted under 35 U.S.C. 154(b) by 112 days.

(21) Appl. No.: 16/701,207

(22) Filed: Dec. 3, 2019

(65) Prior Publication Data
US 2020/0211868 A1 Jul. 2, 2020

(30) Foreign Application Priority Data
Dec. 28, 2018 (JP) .............................. JP2018-248735

(51) Int. Cl.
*H01L 21/677* (2006.01)
*H01L 21/67* (2006.01)

(52) U.S. Cl.
CPC .... *H01L 21/6773* (2013.01); *H01L 21/67276* (2013.01); *H01L 21/67745* (2013.01); *H01L 21/67781* (2013.01)

(58) Field of Classification Search
None
See application file for complete search history.

(56) References Cited

U.S. PATENT DOCUMENTS

| 5,841,515 A | * | 11/1998 | Ohtani | H01L 21/67748 355/27 |
| 6,051,101 A | * | 4/2000 | Ohtani | H01L 21/67161 156/345.32 |
| 2004/0005149 A1 | | 1/2004 | Sugimoto et al. | ............ 396/564 |
| 2007/0056514 A1 | | 3/2007 | Akimoto et al. | ............. 118/716 |

(Continued)

FOREIGN PATENT DOCUMENTS

| JP | 2010-219434 A | 9/2010 |
| JP | 2011-187796 A | 9/2011 |

(Continued)

OTHER PUBLICATIONS

Notice of Allowance dated Apr. 20, 2021 for corresponding Korean Patent Application No. 10-2019-0175132.

(Continued)

*Primary Examiner* — Gerald McClain
(74) *Attorney, Agent, or Firm* — Ostrolenk Faber LLP

(57) ABSTRACT

A substrate treating apparatus and a substrate transporting method. An ID block 2, a coating block 3, a developing block 4, and an IF block 6 are arranged in this order. A platform 13 is placed on the ID block 2, and a platform 47 is placed on the IF block 6. A currently-used carrier platform is provided only on an ID block. Accordingly, a substrate is transported in both a forward path and a return path between the ID block and the IF block. According to the disclosure, a substrate W is transported from the IF block 6 to the developing block 4 in the return path, and thereafter, the substrate W is returned back from the developing block 4 to (Continued)

the IF block 6 without being transported to the coating block 3. Consequently, transportation process by the coating block 3 in the return path is reduced so that an entire throughput of a substrate treating apparatus 1 can be enhanced.

11 Claims, 19 Drawing Sheets

(56) References Cited

U.S. PATENT DOCUMENTS

| | | | |
|---|---|---|---|
| 2009/0044747 A1 | 2/2009 | Nishimura | 118/695 |
| 2010/0215460 A1 | 8/2010 | Watanabe et al. | 414/217 |
| 2010/0228378 A1 | 9/2010 | Fukutomi et al. | 700/112 |
| 2010/0236587 A1 | 9/2010 | Hamada et al. | 134/133 |
| 2011/0222994 A1 | 9/2011 | Inagaki et al. | 414/222.07 |
| 2012/0034062 A1 | 2/2012 | Fukutomi et al. | 414/807 |

FOREIGN PATENT DOCUMENTS

| | | |
|---|---|---|
| KR | 10-2002-0063664 A | 8/2002 |
| KR | 10-2005-0104456 A | 11/2005 |
| KR | 10-2006-0088495 A | 8/2006 |
| KR | 10-2007-0023191 A | 2/2007 |
| KR | 10-2009-0069976 A | 7/2009 |
| KR | 20090069976 A * | 7/2009 |
| WO | WO 2009/060541 A1 | 5/2009 |

OTHER PUBLICATIONS

Office Action dated Feb. 22, 2021 for corresponding Taiwan Patent Application No. 108147787.

* cited by examiner

SUBSTRATE TREATING APPARATUS AND SUBSTRATE TRANSPORTING METHOD

CROSS-REFERENCE TO RELATED APPLICATIONS

This application claims priority to Japanese Patent Application No. 2018-248735 filed Dec. 28, 2018, the subject matter of which is incorporated herein by reference in entirety.

BACKGROUND OF THE INVENTION

Field of the Invention

The present invention relates to a substrate treating apparatus and a substrate transporting method for performing treatment to substrates. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

Description of the Related Art

A currently-used substrate treating apparatus includes an indexer block (hereinafter, referred to an "ID block", where appropriate), a coating block, a developing block, an interface block (hereinafter, referred to an "IF block", where appropriate) in this order (See, for example, Japanese Unexamined Patent Application Publication No. 2010-219434A).

A carrier platform is provided in the ID block. The ID block takes a substrate from a carrier placed on the carrier platform, and transports the taken substrate to the coating block. The coating block performs a coating process such as resist. The developing block performs a developing process on the substrate W to which an exposure process has been performed. The IF block performs loads and unloads the substrate into and from an exposure device.

Moreover, the substrate treating apparatus includes a stocker device (carrier buffer device) See, for example, Japanese Unexamined Patent Application Publication No. 2011-187796A. The stocker device includes keeping shelves for keeping carriers, and a carrier transport mechanism.

SUMMARY OF THE INVENTION

However, the substrate treating apparatus described above possesses the following problems. The substrate treating apparatus transports the substrate to the ID block, the coating block, the developing block, and the IF block in this order (forward path). At this time, the coating block performs the coating process to the substrate while the developing block does not perform the developing process to the substrate. The substrate treating apparatus transports the exposed substrate to the IF block, the developing block, the coating block, and the ID block in this order (return path). At this time, the coating block does not perform the coating process to the substrate while the developing block performs the developing process to the substrate. Such transportation of the substrate reciprocated between the ID block and the IF block accompanies process of only passing the substrate through the block without any process. This may cause a reduced throughput in both the forward path and the return path.

The present invention has been made regarding the state of the art noted above, and its object is to provide a substrate treating apparatus and a substrate transporting method that achieve an enhanced throughput.

Solution to Problem

To achieve the object, the present invention provides a configuration as follows. One aspect of the present invention provides a substrate treating apparatus for performing treatment on a substrate. The substrate treating apparatus includes: a plurality of treating blocks arranged in line and including at least one treating block on a first end side and at least one treating block on a second end side; an indexer block connected to a treating block of the treating blocks on a first end and on which a first carrier platform for placing carriers capable of accommodating substrates thereon is disposed; and an interface block connected to a treating block of the treating blocks on a second end and configured to load and unload the substrate into and from an external device, and on which a second carrier platform for placing the carriers thereon is disposed. The indexer block takes the substrate from the carrier placed on the first carrier platform and transports the taken substrate to the at least one treating block on the first end side. The at least one treating block on the first end side performs a predetermined treatment to the sent substrate, and the at least one treating block on the second end side transports the substrate treated in the at least one treating block on the first end side to the interface block. The interface block unloads the substrate treated in the at least one treating block on the first end side into the external device, loads the substrate from the external device, and sends the substrate treated in the external device to the at least one treating block on the second end side. The at least one treating block on the second end side performs a predetermined treatment to the substrate sent from the interface block, and the interface block returns the substrate treated in the at least one treating block on the second end side to the carrier placed on the second carrier platform.

With the substrate treating apparatus according to the present invention, the first carrier platform is disposed in the indexer block, and the second carrier platform is disposed in the interface block. A currently-used carrier platform is provided only in the indexer block. Accordingly, the substrate is transported in both the forward path and the return path between the indexer block and the interface block. According to this aspect of the present invention, the substrate is transported from the interface block to the at least one treating block on the second end side in the return path, and thereafter, the substrate in the at least one treating block on the second end side is returned back to the interface block without being transported to the at least one treating block on the first end side. Consequently, transportation process by the at least one treating block on the first end side in the return path is reduced so that an entire throughput of the substrate treating apparatus can be enhanced.

Moreover, in the substrate treating apparatus, the treating blocks include a first treating block configured to perform a first treatment, and a second treating block configured to perform a second treatment. The indexer block is connected to the first treating block, the interface block is connected to the second treating block, and the second treating block is connected to the first treating block. The indexer block takes a substrate from the carrier placed on the first carrier platform, and sends the taken substrate to the first treating block. The first treating block performs the first treatment to the sent substrate and sends the substrate subjected to the first treatment to the second treating block. The second treating block sends the substrate subjected to the first treatment to the interface block. The interface block unloads the substrate subjected to the first treatment into the external device, loads the substrate from the external device, and sends the substrate subjected to a third treatment in the external device to the second treating block. The second treating block performs the second treatment to the substrate sent from the interface block and sends the substrate subjected to the second treatment to the interface block. The interface block returns the substrate treated in the second treating block to the carrier placed on the second carrier platform. Such is preferable.

According to this aspect of the present invention, the substrate is transported from the interface block to the second treating block in the return path, and thereafter, the substrate in the second treating block is returned back to the interface block without being transported to the first treating block. Consequently, transportation process by the first treating block in the return path is reduced so that an entire throughput of the substrate treating apparatus can be enhanced.

Another aspect of the present invention provides a substrate treating apparatus for performing treatment on a substrate. The substrate treating apparatus includes: a plurality of treating blocks arranged in line and including at least one treating block on a first end side and at least one treating block on a second end side; an indexer block connected to a treating block of the treating blocks on a first end and on which a first carrier platform for placing carriers capable of accommodating the substrates thereon is disposed; and an interface block connected to a treating block of the treating blocks on a second end and configured to load and unload the substrate into and from an external device, and on which a second carrier platform for placing the carriers thereon is disposed. The interface block takes a substrate from the carrier placed on the second carrier platform and sends the taken substrate to the at least one treating block on the second end side. The at least one treating block on the second end side performs a predetermined treatment to the substrate sent from the interface block. The interface block unloads the substrate treated in the at least one treating block on the second end side into the external device, loads the substrate from the external device, and sends the substrate treated in the external device to the treating block on the second end. The at least one treating block on the second end side sends the substrate treated in the external device to the at least one treating block on the first end side. The at least one treating block on the first end side performs a predetermined treatment to the substrate sent from the at least one treating block on the second end side. The indexer block returns back the substrate treated in the at least one treating block on the first end side to the carrier placed on the first carrier platform.

With the substrate treating apparatus according to the present invention, the first carrier platform is disposed in the indexer block, and the second carrier platform is disposed in the interface block. A currently-used carrier platform is provided only in the indexer block. Accordingly, the substrate is transported in both the forward path and the return path between the indexer block and the interface block. According to this aspect of the present invention, the substrate is transported from the interface block to the at least one treating block on the second end side, and thereafter, the substrate in the at least one treating block on the second end side is returned back to the interface block without being transported to the at least one treating block on the first end side. Consequently, transportation process by the at least one treating block on the first end side is reduced so that an entire throughput of the substrate treating apparatus can be enhanced.

Moreover, in the substrate treating apparatus described above, the treating blocks include a first treating block configured to perform a first treatment, and a second treating block configured to perform a second treatment. The indexer block is connected to the first treating block, the interface block is connected to the second treating block, and the second treating block is connected to the first treating block. The interface block takes the substrate from the carrier placed on the second carrier platform and sends the taken substrate to the second treating block. The second treating block performs the second treatment to the substrate sent from the interface block. The interface block unloads the substrate subjected to the second treatment into the external device, loads the substrate from the external device, and sends the substrate subjected to a third treatment in the external device to the second treating block. The second treating block sends the substrate subjected to the third treatment to the first treating block. The first treating block performs the first treatment to the substrate sent from the second treating block. The indexer block returns the substrate subjected to the first treatment to the carrier placed on the first carrier platform. Such is preferable.

According to this aspect of the present invention, the substrate is transported from the interface block to the second treating block, and thereafter, the substrate in the second treating block is returned back to the interface block without being transported to the first treating block. Consequently, transportation process by the first treating block is reduced so that an entire throughput of the substrate treating apparatus can be enhanced.

It is preferred in the substrate treating apparatus described above that the interface block includes a treating unit configured to perform a fourth treatment and a substrate transport mechanism, the substrate transport mechanism transporting a substrate at least among the second treating block, the carrier placed on the second carrier platform, and the treating unit.

In other words, the substrate transport mechanism transports a substrate not only to the second treating block and the treating unit but to the carrier placed on the second carrier platform provided in the interface block. Accordingly, another substrate transport mechanism is not necessarily provided in a direction where the second treating block and the interface block are arranged. This achieves a compact configuration of the interface block. As a result, reduction in footprint of the substrate treating apparatus is obtainable.

It is preferred in the substrate treating apparatus described above that the interface block includes a second indexer block connected to the second treating block and on which the second carrier platform is disposed, and an IF body block connected to the second indexer block and configured to load and unload the substrate into and from the external device, the second indexer block including a first substrate transport mechanism configured to send the substrate among the second treating block, the carrier placed on the second carrier platform, and the IF body block, the IF body block including a treating unit configured to perform a fourth treatment, and a second substrate transport mechanism, the second substrate transport mechanism sends the substrate at least between the second indexer block and the treating unit.

The interface block includes the second indexer block where the second carrier platform is disposed, and the IF body block. The first substrate transport mechanism of the second indexer block is capable of taking and accommodating the substrate from and into the carrier of the second carrier platform. Accordingly, the second substrate transport mechanism of the IF body block does not necessarily take or accommodate the substrate from and into the carrier of the second carrier platform. That is, transportation operation can be shared with a plurality of substrate transport mechanisms, and thus a decrease in throughput of the substrate transportation apparatus can be prevented.

It is preferred that the substrate treating apparatus described above further includes a carrier transport mechanism configured to transport the carrier between the first carrier platform and the second carrier platform. For instance, when all the substrates are taken from the carrier placed on the first carrier platform, the carrier transport mechanism is capable of transporting the carrier placed on the first carrier platform to the second carrier platform in order to return the substrates to the carrier on the first carrier platform.

It is preferred in the substrate treating apparatus described above that the carrier transport mechanism is mounted on the first treating block and the second treating block. A currently-used carrier transport mechanism is disposed horizontally with respect to the indexer block. With the configuration of the present invention, the carrier transport mechanism is mounted on the first and the second treating blocks. Accordingly, an installation area of the currently-used carrier transport mechanism disposed horizontally with respect to the indexer block can be decreased. In other words, reduction in footprint of the substrate treating apparatus is obtainable.

It is preferred that the substrate treating apparatus described above further includes a carrier storage shelf mounted on at least either the first treating block or the second treating block, and the carrier transport mechanism transports the carrier among the first carrier platform, the second carrier platform, and the carrier storage shelf. A currently-used carrier storage shelf is disposed horizontally with respect to the indexer block. With the configuration of the present invention, the carrier storage shelf is mounted on at least either the first treating block or the second treating block. Accordingly, an installation area of the currently-used carrier storage shelf disposed horizontally with respect to the indexer block can be decreased. In other words, reduction in footprint of the substrate treating apparatus is obtainable.

Another aspect of the present invention provides a substrate transporting method for a substrate treating apparatus. The substrate treating apparatus includes: a plurality of treating blocks arranged in line and including at least one treating block on a first end side and at least one treating block on a second end side; an indexer block connected to the treating block of the treating blocks on a first end and on which a first carrier platform for placing carriers capable of accommodating the substrates thereon is disposed; and an interface block connected to the treating block of the treating blocks on a second end and configured to load and unload a substrate into and from an external device. The substrate transporting method includes: a taking and sending step of causing the indexer block to take the substrate from the carrier placed on the first carrier platform and to send the taken substrate to the treating block on the first end; a first treating step of causing the at least one treating block on the first end side to perform a predetermined treatment to the sent substrate; a first sending step of causing the at least one treating block on the second end side to send the substrate treated in the at least one treating block on the first end side to the interface block; an unloading step of causing the interface block to unload the substrate treated in the at least one treating block on the first end side into the external device; a loading and sending step of causing the interface block to load the substrate into the external device and sending the substrate treated in the external device to the at least one treating block on the second end side; a second treating step of causing the at least one treating block on the second end side to perform a predetermined treatment to the substrate sent from the interface block; and a returning step of causing the interface block to return the substrate treated in the at least one treating block on the second end side into the carrier placed on a second carrier platform provided in the interface block.

With the substrate transporting method according to the present invention, the first carrier platform is disposed in the indexer block, and the second carrier platform is disposed in the interface block. A currently-used carrier platform is provided only in the indexer block. Accordingly, the substrate is transported in both the forward path and the return path between the indexer block and the interface block. According to this aspect of the present invention, the substrate is transported from the interface block to the at least one treating block on the second end side in the return path, and thereafter, the substrate in the at least one treating block on the second end side is transported back to the interface block without being transported to the at least one treating block on the first end side. Consequently, transportation process by the at least one treating block on the first end side in the return path is reduced so that an entire throughput of the substrate treating apparatus can be enhanced.

Another aspect of the present invention provides a substrate transporting method for a substrate treating apparatus. The substrate treating apparatus includes: a plurality of treating blocks arranged in line and including at least one treating block on a first end side and at least one treating block on a second end side; an indexer block connected to the treating block of the treating blocks on a first end and on which a first carrier platform for placing carriers capable of accommodating the substrates thereon is disposed; an interface block connected to the treating block of the treating blocks on a second end and configured to load and unload a substrate into and from an external device and on which a second carrier platform for placing the carriers thereon is provided. The substrate transporting method includes: a taking and sending step of causing the interface block to take the substrate from the carrier placed on the second carrier platform and send the taken substrate to the at least one treating block on the second end side, a first treating step of causing the at least one treating block on the second end side to perform a predetermined treatment to the substrate sent from the interface block; an unloading step of causing the interface block to unload the substrate treated in the at least one treating block on the second end side into the external device; a loading and sending step of causing the interface block to load the substrate from the external device and sending the substrate treated in the external device to the at least one treating block on the second end side; a sending step of causing the at least one treating block on the second end side to send the substrate treated in the external device to the at least one treating block on the first end side; a second treating step of causing the at least one treating block on the first end side to perform a predetermined treatment to the substrate sent from the at least one treating block on the second end side; and a returning step of causing the indexer block to return back the substrate treated in the at least one treating block on the first end side to the carrier placed on the first carrier platform.

With the substrate transporting method according to the present invention, the first carrier platform is disposed in the indexer block, and the second carrier platform is disposed in the interface block. A currently-used carrier platform is provided only in the indexer block. Accordingly, the substrate is transported in both the forward path and the return path between the indexer block and the interface block. According to this aspect of the present invention, the substrate is transported from the interface block to the at least one treating block on the second end side, and thereafter, the substrate in the at least one treating block on the second end side is returned back to the interface block without being transported to the at least one treating block on the first end side. Consequently, transportation process by the at least one treating block on the first end side is reduced so that an entire throughput of the substrate treating apparatus can be enhanced.

Advantageous Effects of Invention

The substrate treating apparatus and the substrate transporting method according to the present invention achieves an enhanced throughput.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1:
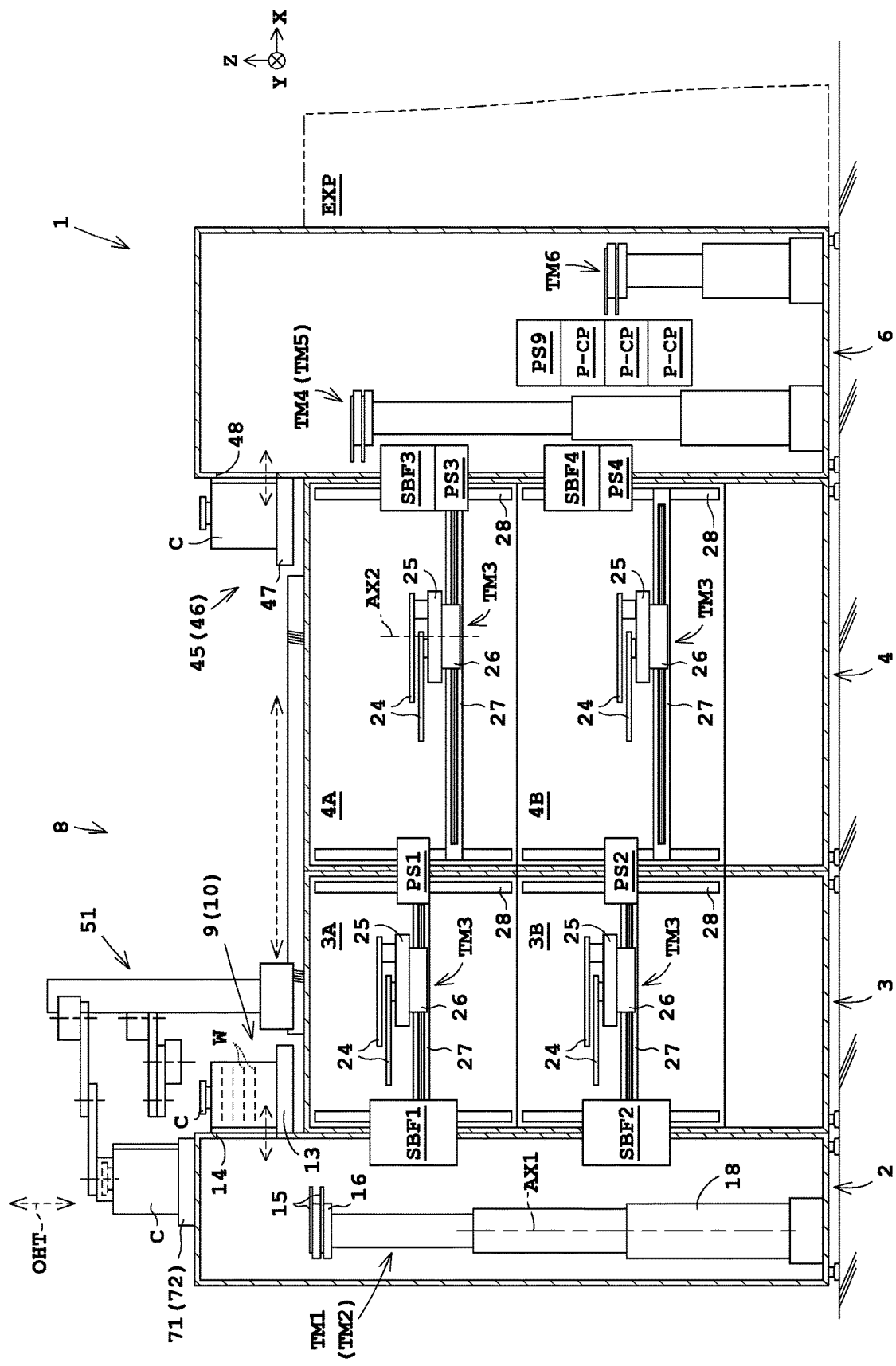
FIG. 1 is a longitudinal cross-sectional view of a substrate treating apparatus according to a first embodiment.
Figure 2:
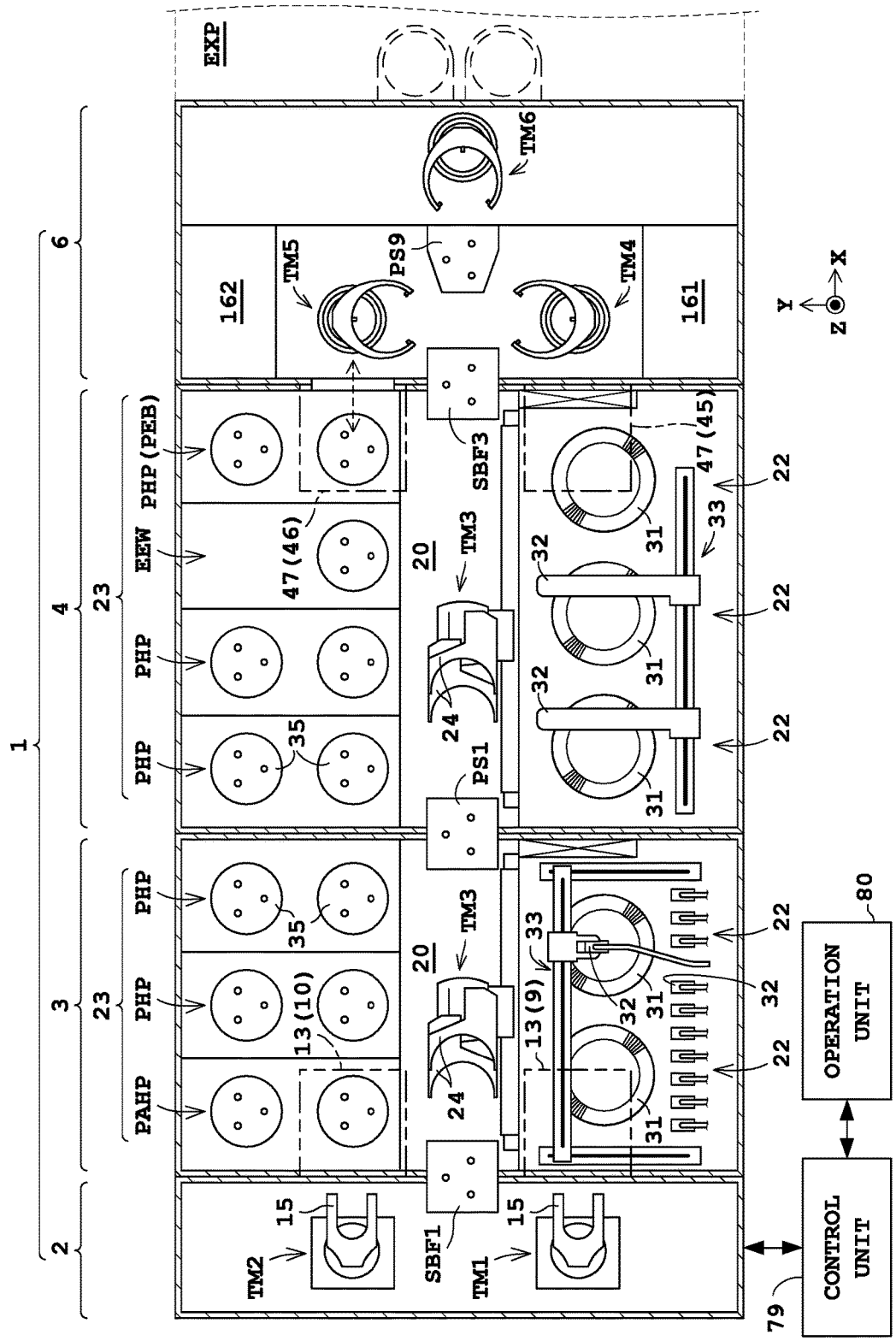
FIG. 2 is a horizontal cross-sectional view of the substrate treating apparatus according to the first embodiment.
Figure 3:
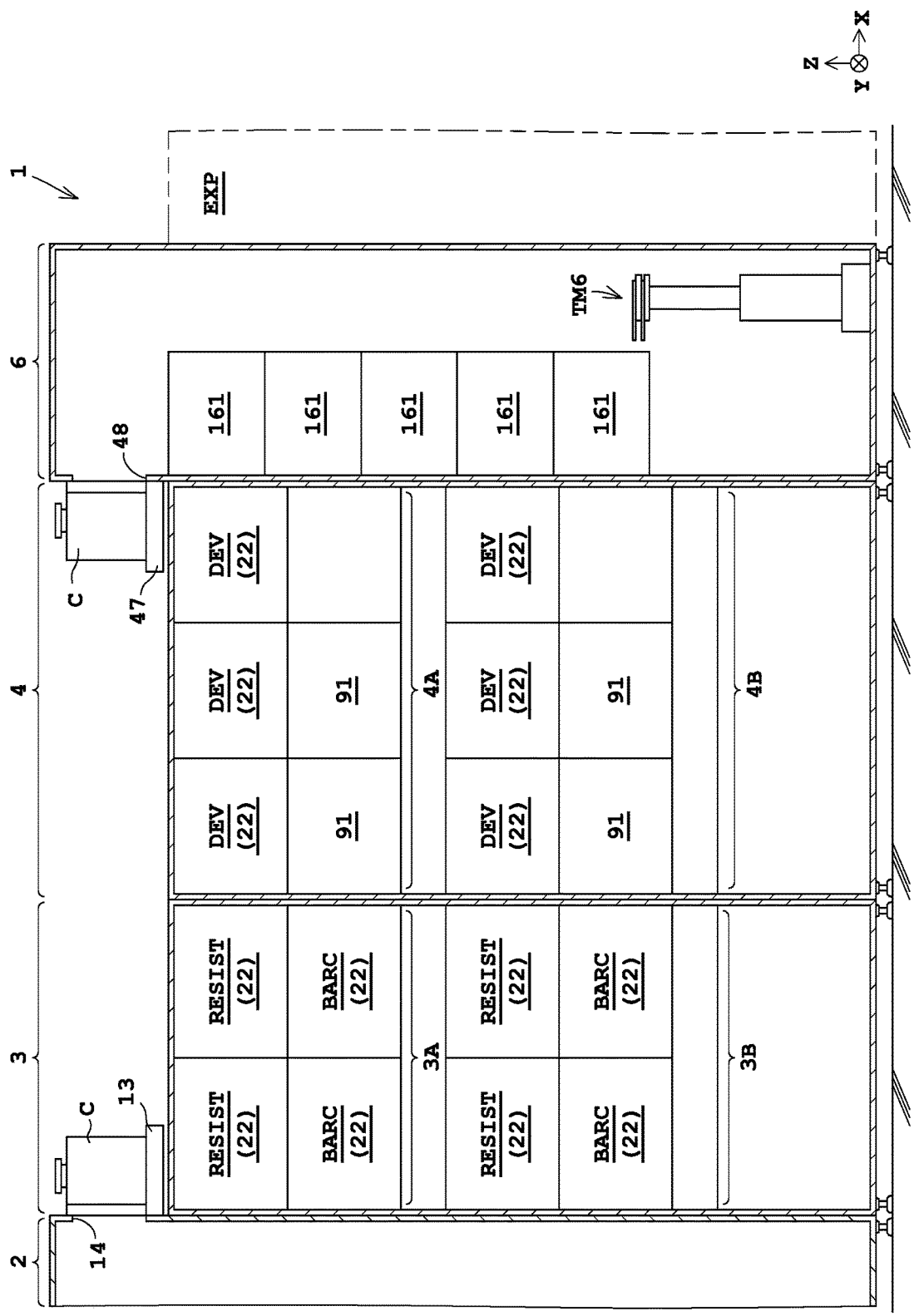
FIG. 3 is a right side view of the substrate treating apparatus according to the first embodiment.
Figure 4:
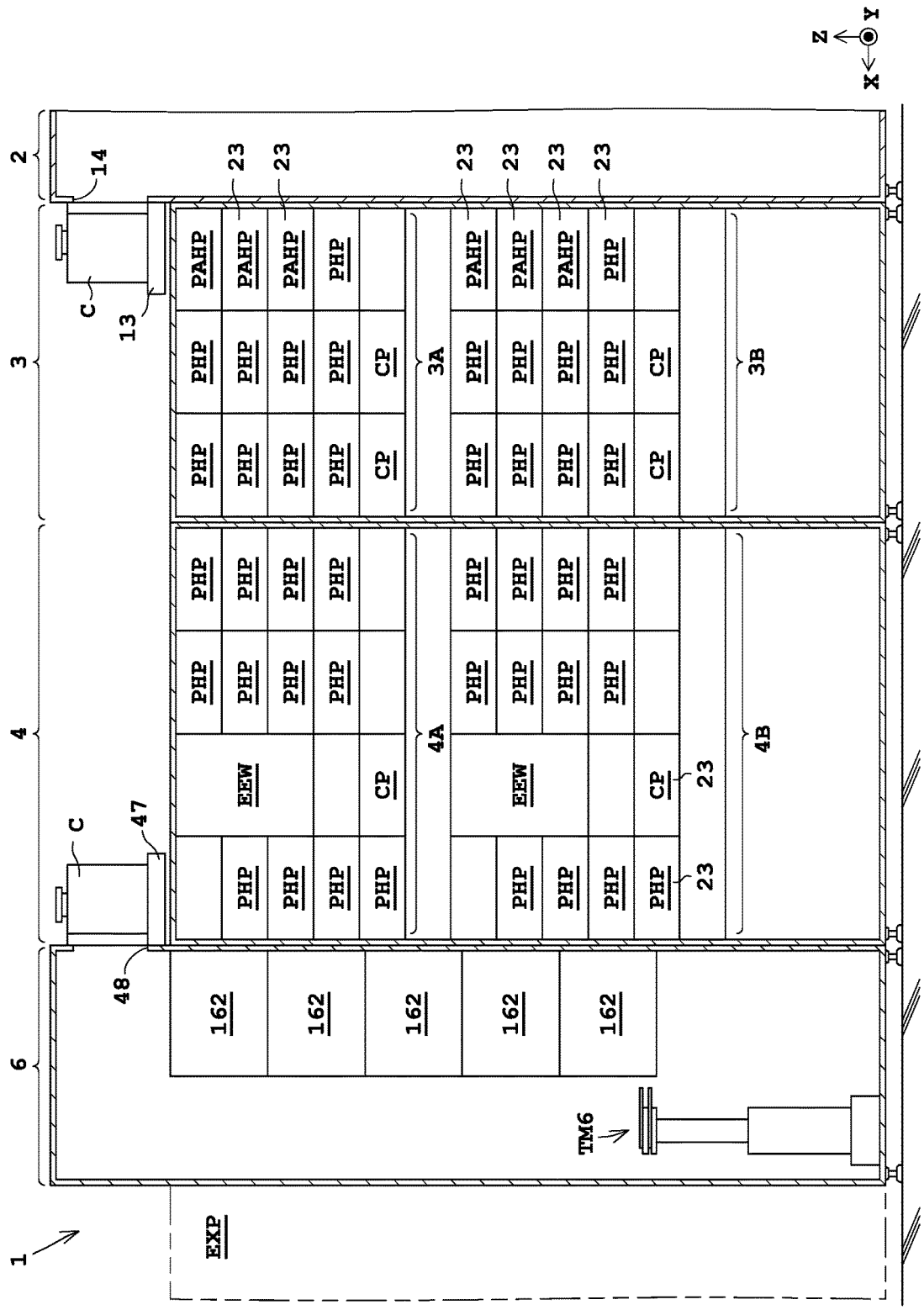
FIG. 4 is a left side view of the substrate treating apparatus according to the first embodiment.

A first embodiment of the present invention will now be described with reference to the drawings. FIG. 1 is a longitudinal cross-sectional view of a substrate treating apparatus according to the first embodiment. FIG. 2 is a horizontal cross-sectional view of the substrate treating apparatus. FIG. 3 is a right side view of the substrate treating apparatus. FIG. 4 is a left side view of the substrate treating apparatus.

Configuration of Substrate Treating Apparatus 1

Description will be made with reference to FIG. 1 or 2. The substrate treating apparatus 1 includes an indexer block (ID block) 2, a coating block 3, a developing block 4, an interface block (IF block) 6, and a carrier buffer device 8. The ID block 2, the coating block 3, the developing block 4, the IF block 6, and an exposure device EXP are arranged linearly in a horizontal direction (X-direction).

Here in this embodiment, the coating block 3 corresponds to a first treating block of the present embodiment and the developing block 4 corresponds to a second treating block of the present invention. Moreover, the exposure device EXP corresponds to the external device in the present invention.

Configuration of Indexer Block 2

The ID block 2 includes two openers 9, 10 (see FIGS. 2 and 6) and two substrate transport mechanisms TM1, TM2. The two openers (carrier platforms) 9, 10 provided in the ID block 2 each include a carrier C placed thereon that is capable of accommodating a plurality of substrates W.

The carrier C is capable of accommodating a plurality of (e.g., 25) substrates W in a horizontal orientation. For instance, a FOUP (Front Open Unified Pod) is used as the carrier C. Alternatively, a container except the FOUP (e.g., a Standard Mechanical Inter Face (SMIF) pod) is usable. The carrier C includes, for example, a carrier body with an opening formed therein through which the substrates W are inserted or taken out and configured to accommodate the substrates W, and a lid for covering the opening of the carrier body.

The openers 9, 10 each include a platform 13 on which the carrier C is placed, an opening 14 through which the substrates W pass, a shutter (not shown) configured to open and close the opening 14 and to attach and detach the lid to and from the carrier body, and a shutter drive mechanism (not shown) configured to drive the shutter. The shutter drive mechanism includes an electric motor. Here, the shutter detaches the lid from the carrier body, and thereafter, moves downwardly or horizontally with respect to the opening 14 (Y-direction), for example.

The platforms 13 of the two openers 9, 10 are provided on the roof of the coating block 3. In FIG. 1, the platforms 13 are provided higher in level than the coating block 3, i.e., above the coating block 3. The platforms 13 may be provided on the coating block 3, i.e., may contact the coating block 3. The platform 13 corresponds to a first carrier platform of the present invention.

The substrate transport mechanisms TM1, TM2 include two hands 15, a forward/rearward driving unit 16, and a lifting/lowering rotation driving unit 18. Each of the two hands 15 holds the substrate W. Moreover, each of the two hands 15 is movably attached to the forward/rearward driving unit 16. The forward/rearward driving unit 16 is capable of moving the two hands 15 into the carrier C simultaneously. Moreover, the forward/rearward driving unit 16 is capable of moving the two hands 15 forward and backward individually. Accordingly, the forward/rearward driving unit 16 is capable of moving one of the two hands 15 into the carrier C.

The lifting/lowering rotation driving unit 18 lifts, lowers, and rotates the forward/rearward driving unit 16 to thereby lift, lower, and rotate the two hands 15. In other words, the lifting/lowering rotation driving unit 18 allows the forward/rearward driving unit 16 to move in an upward/downward direction (Z-direction) and to rotate the forward/rearward driving unit 16 about a vertical axis AX1. The forward/rearward driving unit 16 and the lifting/lowering rotation driving unit 18 each include an electric motor, for example. The two substrate transport mechanisms TM1, TM2 are fixed on a floor of the ID block 2 individually so as not to move horizontally (especially, Y-direction).

A feeding substrate buffer SBF1 is disposed between the ID block 2 and an upper coating-treatment layer 3A of the coating block 3 mentioned later. A feeding substrate buffer SBF2 is disposed between the ID block 2 and a lower coating-treatment layer 3B of the coating block 3 mentioned later. Each of the two feeding substrate buffers SBF1, SBF2 is configured to place the substrates W thereon.

The first substrate transport mechanism TM1 transports a substrate W from the carrier C placed on the platform 13 of the opener 9 to either the feeding substrate buffer SBF1 or SBF2. Moreover, the second substrate transport mechanism TM2 transports a substrate W from the carrier C placed on the platform 13 of the opener 10 to either the feeding substrate buffer SBF1 or SBF2. Here, the first substrate transport mechanism TM1 is capable of taking the substrate W from the carrier C of the opener 9, but is incapable of taking the substrate W from the carrier C of the opener 10. Moreover, the second substrate transport mechanism TM2 is capable of taking the substrate W from the carrier C of the opener 10, but is incapable of taking the substrate W from the carrier C of the opener 9.

Configuration of Coating Block 3 and Developing Block 4

The coating block 3 is connected to the ID block 2. The coating block 3 performs a coating treatment as the first treatment. Moreover, the developing block 4 is connected to the coating block 3. The developing block 4 performs a developing treatment as the second treatment.

The coating block 3 includes the upper coating-treatment layer 3A and the lower coating-treatment layer 3B. The developing block 4 includes an upper developing-treatment layer 4A and the lower developing-treatment layer 4B. The four treatment layers 3A, 3B, 4A, 4B each include a third substrate transport mechanism TM3, a transportation space 20 (see FIG. 2), a liquid treating unit 22, and a heat-treatment unit 23.

The third substrate transport mechanism TM3 is configured to transport the substrates W in each of the four treatment layers 3A, 3B, 4A, 4B. The third substrate transport mechanism TM3 includes two hands 24, a forward/rearward driving unit 25, a rotation driving unit 26, a first movement mechanism 27, and a second movement mechanism 28.

Each of the two hands 24 holds the substrate W. Moreover, each of the two hands 24 is movably attached to the forward/rearward driving unit 25. The forward/rearward driving unit 25 moves the two hands 24 forward and backward individually. The rotation driving unit 26 causes the forward/rearward driving unit 25 to rotate about a vertical axis AX2. Accordingly, the orientation of each of the two hands 24 can be changed. The first movement mechanism 27 moves the rotation driving unit 26 in the forward/rearward direction (X-direction) as in FIG. 1. Accordingly, the forward/rearward driving unit 25 can be moved in the X-direction. The second movement mechanism 28 moves the first movement mechanism 27 in the upward/downward direction (Z-direction). Accordingly, the forward/rearward driving unit 25 can be moved in the Z-direction.

Each of the forward/rearward driving unit 25, the rotation driving unit 26, the first movement mechanism 27, and the second movement mechanism 28 includes an electric motor.

The third substrate transport mechanism TM3 is disposed in the transportation space 20. The transportation space 20 is configured to extend in the horizontal direction (X-direction) linearly. The transportation space 20 is a rectangular space when seen from above the substrate treating apparatus 1. The liquid treating unit 22 and the heat-treatment unit 23 are disposed to sandwich the transportation space 20.

A substrate platform PS1 is disposed between the upper coating-treatment layer 3A and the upper developing-treatment layer 4A. A substrate platform PS2 is disposed between the lower coating-treatment layer 3B and the lower developing-treatment layer 4B.

A feeding substrate buffer SBF3 and a substrate platform PS3 are disposed between the upper developing-treatment layer 4A and the IF block 6. A feeding substrate buffer SBF4 and a substrate platform PS4 are disposed between the lower developing-treatment layer 4B and the IF block 6. Each of the four substrate platforms PS1 to PS4 may be configured to place one substrate W or two or more substrates W. Each of the two feeding substrate buffers SBF3, SBF4 is capable of placing substrates W.

FIG. 3 is a right side view illustrating arrangement of the liquid treating units 22 in the coating block 3 and the developing block 4. Each of the two coating-treatment layers 3A, 3B includes four liquid treating units 22. The four liquid treating units 22 are arranged in two lines in the horizontal direction and two levels in the upward/downward direction, that is, the liquid treating units 22 are arranged in 2 lines×2 levels. Of the four liquid treating units 22, the lower two liquid treating units 22 are each a coating unit BARC. The upper two liquid treating units 22 are each a coating unit RESIST. The coating unit BARC forms an antireflection film on the substrate W. The coating unit RESIST forms a resist film, such as a photoresist, on the substrate W.

Each of the two developing-treatment layers 4A, 4B includes three liquid treating units 22. The three liquid treating units 22 are arranged in three lines x one levels. Moreover, the three liquid treating units 22 are each a developing unit DEV. The developing unit DEV develops the exposed substrate W.

As illustrated in FIG. 2, the liquid treating unit 22 includes a holding rotation portion 31, nozzles 32, and a nozzle moving mechanism 33. The holding rotation portion 31 holds substrates W by, for example, vacuum adsorption and rotates the substrates W held by the holding rotation portion 31 about the vertical axis (Z-direction). The rotation is performed by an electric motor, for example. The nozzles 32 are configured to supply a coating solution (e.g., a solution for forming an antireflection film or a photoresist solution) or a developer to the substrates W. The nozzle moving mechanism 33 moves the nozzles 32 to any positions. The nozzle moving mechanism 33 includes an electric motor, for example.

FIG. 4 illustrates arrangement of the heat-treatment units 23 in the coating block 3 and the developing block 4. Each of the four treatment layers 3A, 3B, 4A, 4B includes a plurality of heat-treatment units 23. The heat-treatment unit 23 performs a heat treatment, and includes a plate 35 (see FIG. 2) on which the substrate W is placed. For instance, the plate 35 is heated with a heater, and is cooled with a water-cooled mechanism.

The heat-treatment units 23 are arrangeable in three lines x five levels in the two coating-treatment layers 3A, 3B. In FIG. 4, each of the two coating-treatment layers 3A, 3B includes fourteen heat-treatment units 23. That is, each of the two coating-treatment layers 3A, 3B includes three adhesion enhancing treatment units PAHP, two cooling units CP, and nine heating/cooling units PHP.

Moreover, the heat-treatment units 23 are arrangeable in four lines×five levels in the two developing-treatment layers 4A, 4B. Each of the two developing-treatment layers 4A, 4B includes one cooling unit CP, twelve heating/cooling units PHP, and one edge exposing unit EEW. It should be noted that the number and types of the liquid treating units 22, the heat-treatment units 37, and other units are variable where appropriate.

The adhesion enhancing treatment units PAHP are configured to apply an adhesion enhancing agent such as hexamethyldisilazane (HMDS) to substrates W and heats the resulting substrates W to thereby enhance adhesion between the substrates W and the antireflection films. The adhesion enhancing treatment units PAHP also have the function of cooling the substrates W after heating. The cooling units CP cool the substrates W. The heating/cooling units PHP sequentially perform heating and cooling in this order. The edge exposing unit EEW exposes a peripheral edge of the substrate W.

Interface Block (IF Block) 6

The IF block 6 is connected to the developing block 4. The IF block 6 loads and unloads the substrate W into and from the exposure device EXP that is configured to perform an exposure treatment as a third treatment. The IF block 6 includes three substrate transport mechanisms TM4 to TM6, a plurality of pre-exposure cleaning units 161, a plurality of post-exposure cleaning units 162, three mounting-cum-cooling units P-CP, and a substrate platform PS 9 (see FIGS. 1 and 2). Moreover, two openers 45, 46 are provided in the IF block 6 (see FIGS. 2 and 6).

The fourth substrate transport mechanism TM4 and a fifth substrate transport mechanism TM5 are disposed in a Y-direction perpendicular with respect to the forward/rearward direction (X-direction). The sixth substrate transport mechanism TM6 is disposed rearward of the two substrate transport mechanisms TM4, TM 5 (right side of FIG. 1). The pre-exposure cleaning unit 161 faces the post-exposure cleaning unit 162 across the two substrate transport mechanisms TM4, TM5. The pre-exposure cleaning unit 161 cleans and dries the substrate W prior to an exposure treatment. The post-exposure cleaning unit 162 cleans and dries the substrate W subsequent to the exposure treatment. Each of the cleaning units 161, 162 includes a holding rotation portion configured to hold the substrate W, and nozzles through which such as a cleaning liquid or a rinse liquid is dispensed to the substrate W. Moreover, each of the cleaning units 161, 162 may perform polishing to a back face and an edge (bevel portion) of the substrate W with use of a brush and the like. Here, the back face of the substrate W is a face opposite to the face where circuit patterns are formed, for example.

Three mounting-cum-cooling units P-CP and one substrate platform PS9 are surrounded by the three substrate transport mechanisms TM4 to TM6. The three mounting-cum-cooling units P-CP and the one substrate platform PS9 are arranged in the upward/downward direction. Each of the three mounting-cum-cooling units P-CP and one substrate platform PS9 is capable of placing one or more substrates W thereon.

The fourth substrate transport mechanism TM4 is capable of transporting a substrate W among the two feeding substrate buffers SBF3, SBF4, the three substrate platforms PS3, PS4, PS9, the three mounting-cum-cooling units P-CP, the pre-exposure cleaning unit 161, and the carrier C placed on the opener 45.

The fifth substrate transport mechanism TM5 is capable of transporting a substrate W among the two feeding substrate buffers SBF3, SBF4, the three substrate platforms PS3, PS4, PS9, the three mounting-cum-cooling units P-CP, the post-exposure cleaning unit 162, and the carrier C placed on the opener 46. Moreover, the fifth substrate transport mechanism TM5 is capable of delivering and receiving the substrate W to and from the eight in total heating/cooling units PHP (see FIGS. 2, 4) arranged adjacent to the IF block 6 in the upward/downward direction not via other components, such as the feeding substrate buffer SBF3 and the substrate platform PS3, but directly.

The sixth substrate transport mechanism TM6 is capable of transporting a substrate W among the substrate platform PS9, the three mounting-cum-cooling units P-CP, and the exterior exposure device EXP. Each of the three substrate transport mechanisms TM4 to TM6 is configured in substantially the same manner as that of the first substrate transport mechanism TM1, for example, and thus the description thereof is to be omitted.

The two openers 45, 46 provided in the IF block 6 each include the carrier C placed thereon. Similarly to the opener 9, the openers 45, 46 each include a platform 47 on which the carrier C is placed, an opening 48 through which the substrates W pass, a shutter (not shown) configured to open and close the opening 48 and to attach and detach the lid to and from the carrier body, and a shutter drive mechanism (not shown) configured to drive the shutter. The shutter drive mechanism includes an electric motor.

The fourth substrate transport mechanism TM4 is capable of taking a substrate W from the carrier C placed on the opener 45, and is also capable of accommodating a substrate W into the carrier C. However, the fourth substrate transport mechanism TM4 is incapable of taking a substrate W from the carrier C placed on the opener 46, and is also incapable of accommodating a substrate W into the carrier C. Moreover, the fifth substrate transport mechanism TM5 is capable of taking a substrate W from the carrier C placed on the opener 46, and is also capable of accommodating a substrate W into the carrier C. However, the fifth substrate transport mechanism TM5 is incapable of taking a substrate W from the carrier C placed on the opener 45, and is also incapable of accommodating a substrate W into the carrier C.

The platforms 47 of the two openers 45, 46 are provided on the roof of the developing block 4. In FIG. 1, the platforms 47 are provided higher in level than the developing block 4, i.e., above the developing block 4. The platforms 47 may be provided on the developing block 4, i.e., may contact the developing block 4. The platform 47 corresponds to a second carrier platform of the present invention.

Carrier Buffer Device 8

The substrate treating apparatus 1 includes a carrier buffer device 8 on or above the coating block 3 and the developing block 4. The carrier buffer device 8 includes a carrier transport mechanism 51 and a carrier storage shelf 53 (see FIG. 6).

Figure 5:
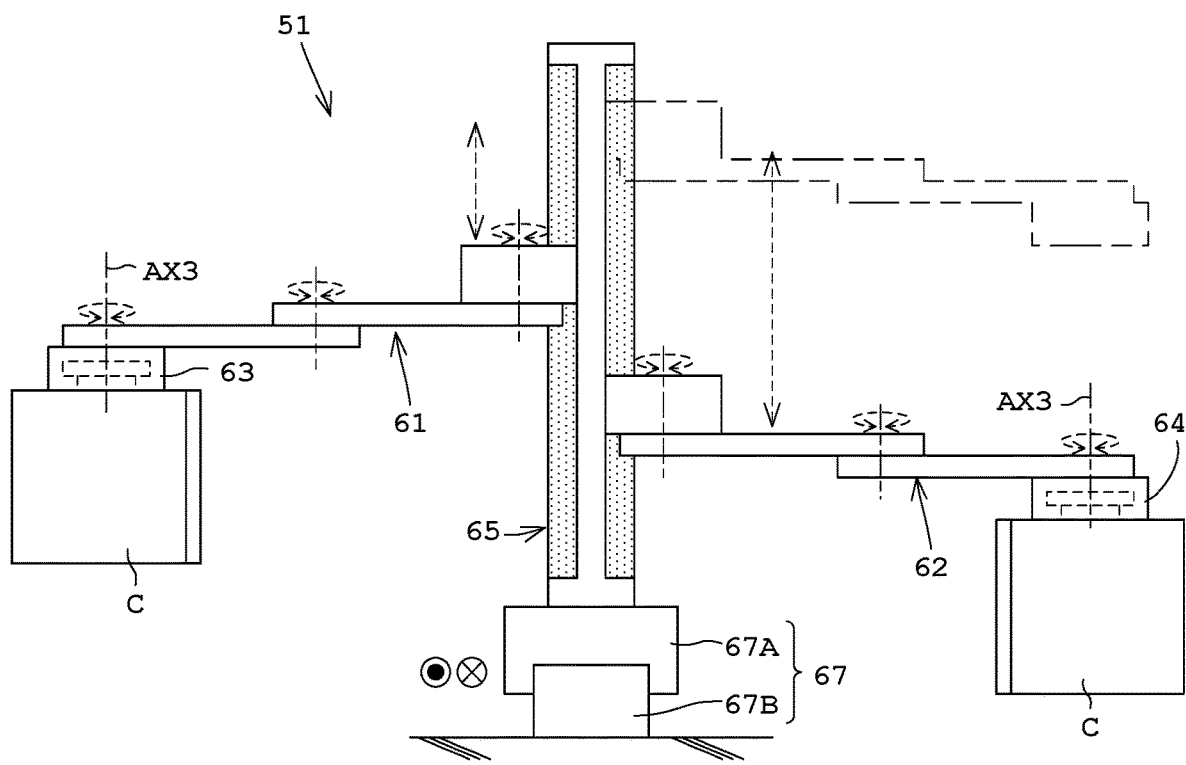
FIG. 5 illustrates a carrier transport mechanism.

Reference is made to FIG. 5. FIG. 5 illustrates the carrier transport mechanism 51. The carrier transport mechanism 51 includes two articulated arms 61, 62. A first articulated arm 61 includes a first end with a gripper 63, and a second articulated 62 includes a first end with a gripper 64. Moreover, the first articulated arm 61 includes a second end supported on a strut lifting/lowering driving unit 65 so as to be movable in the upward/downward direction. The second articulated arm 62 includes a second end supported on the lifting/lowering driving unit 65 so as to be movable in the upward/downward direction.

Each of the two grippers 63, 64 is configured to grasp a projection provided on a top face of the carrier C, for example. The two grippers 63, 64 each include an electric motor.

The two articulated arms 61, 62 each include one electric motor or two or more electric motors. The first articulated arm 61 is configured to cause the first gripper 63 to be rotatable to 360 degrees about a vertical axis AX3. The second articulated arm 62 is configured in the same manner as the first articulated arm 61. For instance, the first articulated arm 61 may be in charge of transporting the carrier C on the upper side (adjacent to the openers 10, 46) in FIG. 6, whereas the second articulated arm 62 may be in charge of transporting the carrier C on the lower side (adjacent to the openers 9, 45) in FIG. 6.

The lifting/lowering driving unit 65 is configured to cause the two articulated arms 61, 62 to be liftable individually. The lifting/lowering driving unit 65 includes an electric motor. The lifting/lowering driving unit 65 may include a belt and two or more pulleys, for example, for one articulated arm.

A forward/backward driving unit 67 includes a supporting portion 67A configured to support the lifting/lowering driving unit 65, a longitudinal portion 67B extending longitudinally in the forward/rearward direction (X-direction), and an electric motor (not shown). For instance, the longitudinal portion 67B may be a rail (guide rail) and the supporting portion 67A may be a carriage. In this case, the electric motor may cause the carriage (supporting portion 67A) to move along the rail (longitudinal portion 67B).

Moreover, the electric motor, the two or more pulleys, the belt, and the guide rail may be accommodated in the longitudinal portion 67B, and the supporting portion 67A may be fixed to the belt. In this case, the electric motor may cause the pulleys to rotate to move the belt on the pulleys, whereby supporting portion 67A is moved along the guide rail.

Figure 6:
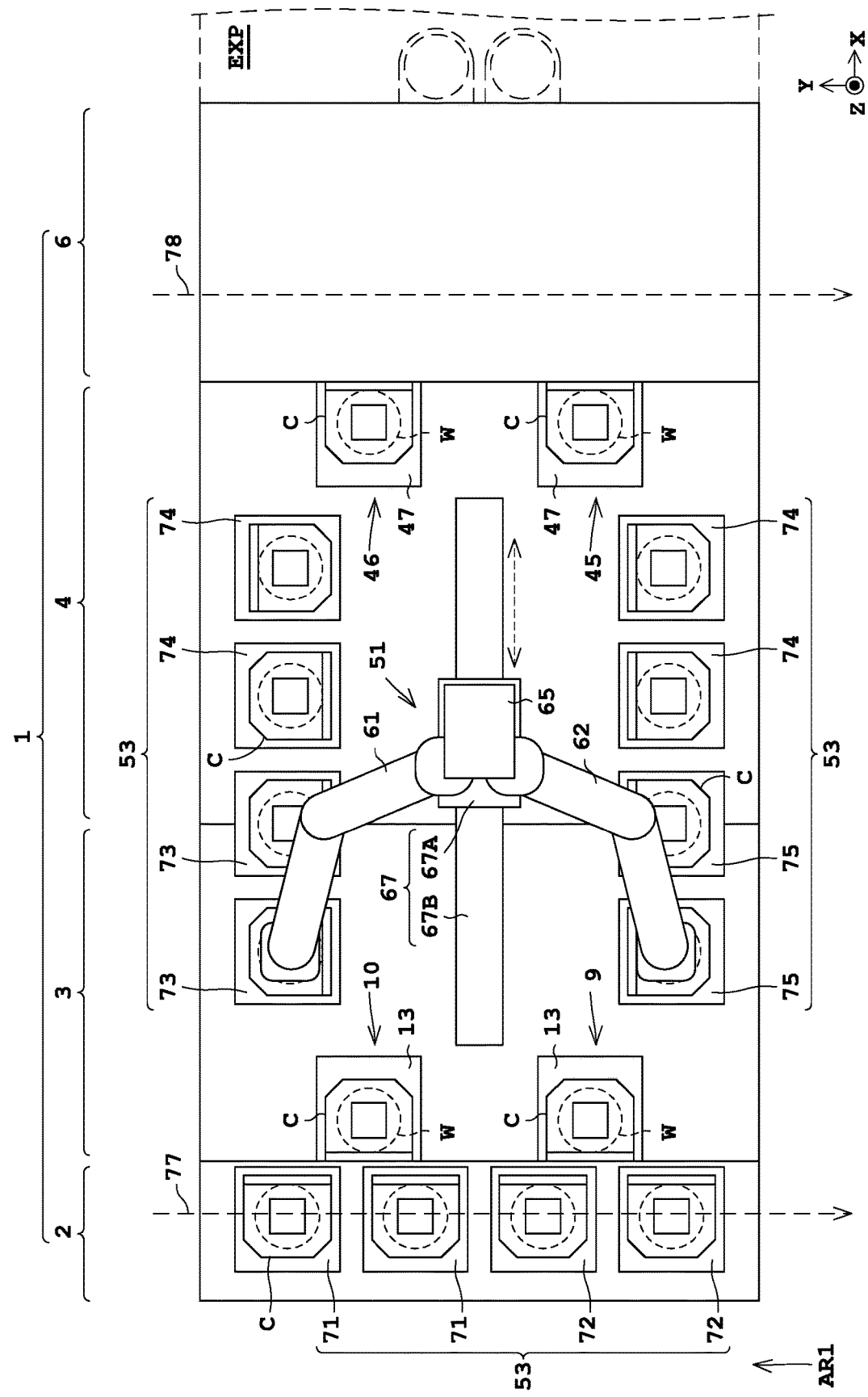
FIG. 6 illustrates a carrier buffer device.

Reference is made to FIG. 6. The carrier storage shelf 53 includes input ports 71, output ports 72, untreated substrate carrier shelves 73, empty carrier shelves 74, and treated substrate carrier shelves 75. The input ports 71 are each a shelf for receiving the carrier C where untreated substrates W are accommodated from an external transport mechanism OHT (Overhead Hoist Transport). The external transport mechanism OHT transports a carrier C in the factory. The term untreated means the condition where neither the coating block 3 nor the developing block 4 performs any treatment to the substrate. As illustrated in FIGS. 1 and 6, the input port 71 is provided on the ID block 2, i.e., on the roof of the ID block 2. A rail 77 for the external transport mechanism OHT is provided above the ID block 2. The external transport mechanism OHT transports a carrier C to one of the two input ports 71.

Moreover, as illustrated in FIG. 6, the untreated substrate carrier shelves 73, the empty carrier shelves 74, and the treated substrate carrier shelves 75 are arranged along the longitudinal portion 67B in a longitudinal direction of the substrate treating apparatus 1. The untreated substrate carrier shelf 73 accommodates a carrier C which was placed on the input port 71, not transported to either of the two platforms 13, and accommodating untreated substrates W. The empty carrier shelf 74 accommodates a carrier C from which all the substrates W are taken on the platform 13, and which was not transported to either of the two platforms 47. The treated substrate carrier shelf 75 accommodates a carrier C accommodating the treated substrates W and not transported to either of the two output ports 72. In this embodiment, the term treated means the condition where the coating block 3 and the developing block 4 perform treatment to the substrate.

The output port 72 is a shelf for delivering a carrier C where the treated substrates W are accommodated to the external transport mechanism OHT. As illustrated in FIGS. 1 and 6, the output port 72 is provided on the ID block 2, i.e., on the roof of the ID block 2. The carrier transport mechanism 51 allows a carrier C to move freely among the platforms 13, 47 and the shelves 71 to 75.

Moreover, as illustrated in FIGS. 1 and 6, the platform 13 and the opening 14 (openers 9, 10) are disposed adjacent to the coating block 3, and the platform 47 and the opening 48 (openers 45, 46) are disposed adjacent to the developing block 4. In other words, the platform 13 and the platform 47 are disposed so as to face each other. Accordingly, the platform 13 and the platform 47 face the carrier transport mechanism 51, whereby the carrier transport mechanism 51 can transport the carrier C easily. Moreover, if the platform is disposed opposite to the coating block 3 (see the arrow AR1 in FIG. 6) across the ID block 2 in a currently-used manner, the platform 13 protrudes, for example. In contrast to this, in this embodiment, since the platform 13 and the platform 47 are disposed so as to face each other, protrusion of the platform 13 can be prevented. As a result, reduction in footprint of the substrate treating apparatus 1 is obtainable.

The carrier transport mechanism 51 includes the two-paired articulated arms 61, 62 and grippers 63, 64. Alternatively, one-paired articulated arm and gripper and three or more paired articulated arms and grippers may be provided. Moreover, the lifting/lowering driving unit 65 may be configured to be rotatable about a vertical axis with respect to the supporting portion 67A. Moreover, when the external transport mechanism OHT passes above the IF block 6 as illustrated by the numeral 78 in FIG. 6, the input port 71 and the output port 72 may be provided on the IF block 6, i.e., on the roof of the IF block 6.

Moreover, as illustrated in FIG. 2, the substrate treating apparatus 1 includes one or more control units 79 and an operation unit 80. Each of the control units 79 includes, for example, a central processing unit (CPU). The control units 79 control components of the substrate treating apparatus 1. The operation unit 80 includes a display unit (e.g., liquid crystal monitor), a memory unit, and an input unit. The memory unit includes, for example, at least one of a read-only memory (ROM), random-access memory (RAM), and a hard disk. The input unit includes at least one of a keyboard, a mouse, a touch panel, and various buttons. The memory unit stores conditions for substrate treatments and operation programs necessary for controlling the substrate treating apparatus 1.

Operation of Substrate Treating Apparatus 1

An operation of the substrate treating apparatus 1 will now be described. It should be noted that a plurality of processes performed in the substrate treating apparatus 1 is one example, and an operator selects a required process from them. Reference is made to FIG. 1. The external transport mechanism OHT transports a carrier C to the input ports 71 on the ID block 2. The carrier transport mechanism 51 transports the carrier C from the input port 71 to the platform 13 of the opener 9, for example. The shutter of the opener 9 opens the opening 14 while removing and holding the lid of the carrier C.

The first substrate transport mechanism TM1 of the ID block 2 takes a substrate W from the carrier C placed on the carrier platform 13 of the opener 9, and transports the taken substrate W to the coating block 3. Specifically, the first substrate transport mechanism TM1 transports the substrate W taken from the carrier C to the two feeding substrate buffers SBF1, SBF2 alternately.

When all the substrates W are taken from the carrier C, the opener 9 closes the opening 14 with the shutter while attaching the lid to the carrier C. Thereafter, the carrier transport mechanism 51 replaces the empty carrier C by a carrier C accommodating untreated substrates W. Thereafter, the carrier transport mechanism 51 transports the empty carrier C to the platform 47 of the opener 45, for example. If the empty carrier C is incapable of being transported to either the opener 45 or 46, the carrier transport mechanism 51 transports the empty carrier C to the empty carrier shelf 74.

The coating block 3 performs a coating treatment on the substrate W sent from the ID block 2, and transports the substrate W subjected to the coating treatment to the developing block 4. Detailed description is as under.

In the first coating-treatment layer 3A of the coating block 3, for example, the third substrate transport mechanism TM3 receives a substrate W from the feeding substrate buffer SBF1. The third substrate transport mechanism TM3 transports the received substrate W to an adhesion enhancing treatment unit PAHP, a cooling unit CP, and a coating unit BARC illustrated in FIGS. 3 and 4 in this order. Thereafter, the third substrate transport mechanism TM3 transports the substrate W on which an antireflection film is formed by the coating unit BARC, to a heating/cooling unit PHP, a cooling unit CP, a coating unit RESIST, and a heating/cooling unit PHP in this order. The third substrate transport mechanism TM3 transports the substrate W on which a resist film is formed by the coating unit RESIST to the substrate platform PS1. It should be noted that a process by the adhesion enhancing treatment unit PAHP is omittable.

Figure 7:
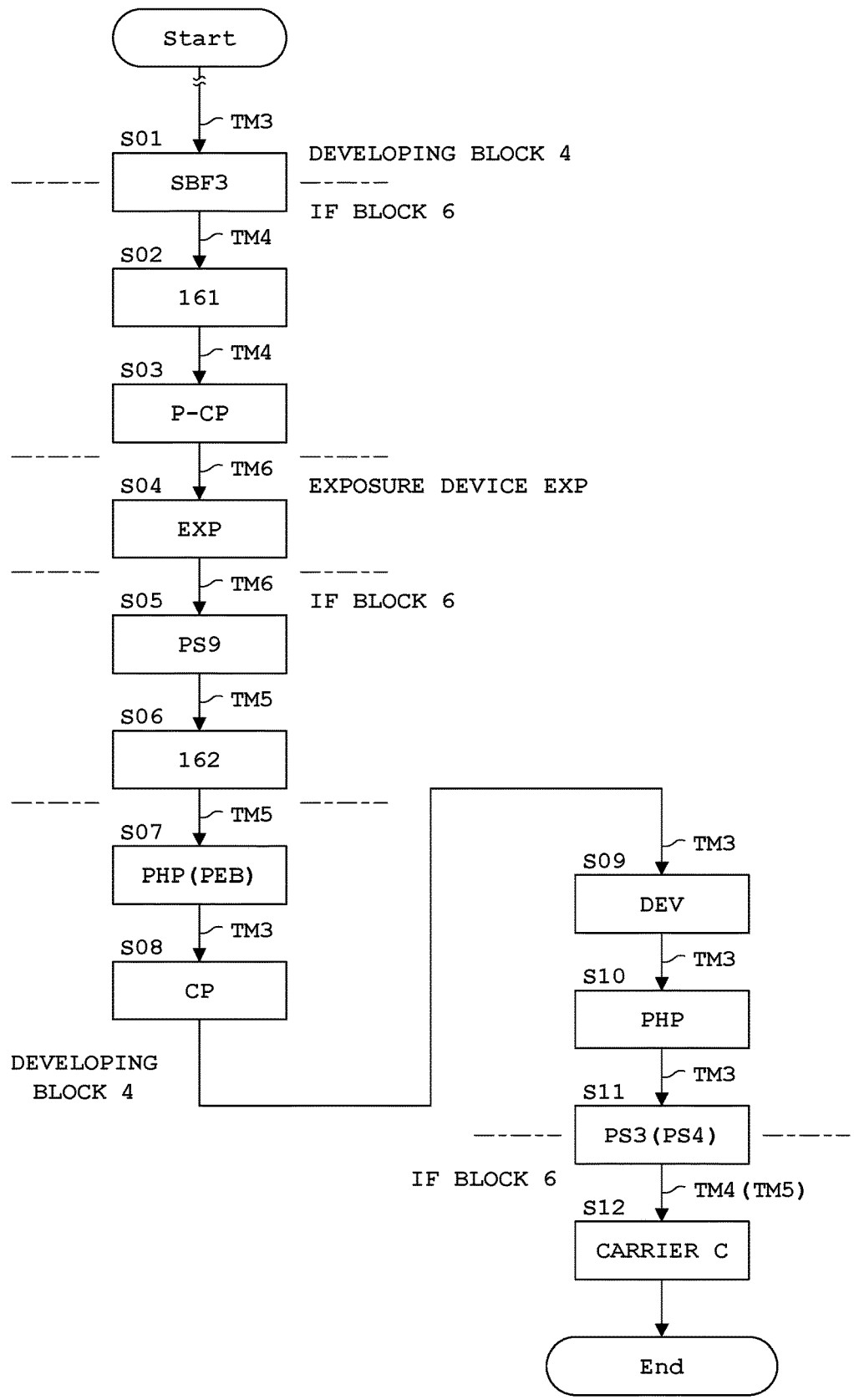
FIG. 7 is a flow chart illustrating operation of the substrate treating apparatus according to the first embodiment.

The developing block 4 performs no developing treatment to the substrate W subjected to the coating treatment, and transports the coated substrate W to the IF block 6. Specifically, the third substrate transport mechanism TM3 in the developing-treatment layer 4A transports the substrate W from the substrate platform PS1 to the feeding substrate buffer SBF3 (see step S01 in FIG. 7).

The IF block 6 unloads the substrate W sent from the developing block 4 and subjected to the coating treatment into the exposure device EXP. Thereafter, the IF block 6 loads the substrate W subjected to the exposure treatment from the exposure device EXP. Thereafter, the IF block 6 transports the substrate W subjected to the exposure treatment to the developing block 4. Detailed description is as under.

The fourth substrate transport mechanism TM4 in the IF block 6 receives the substrate W from the feeding substrate buffer SBF3, and transports the received substrate W to the pre-exposure cleaning unit 161 and the mounting-cum-cooling unit P-CP in this order (steps S02, S03). The sixth substrate transport mechanism TM6 transports the substrate W from the mounting-cum-cooling unit P-CP to the exposure device EXP (step S04). The exposure device EXP performs the exposure treatment to the transported substrate W.

The sixth substrate transport mechanism TM6 transports the substrate W exposed by the exposure device EXP from the exposure device EXP to the substrate platform PS9 (step S05). The fifth substrate transport mechanism TM5 receives the substrate W from the substrate platform PS9, and transports the received substrate W to the post-exposure cleaning unit 162 (step S06). Thereafter, the fifth substrate transport mechanism TM5 transports the substrate W directly to the heating/cooling unit PHP, for example, in the developing-treatment layer 4A of the developing block 4 (step S07). The heating/cooling unit PHP in the developing-treatment layer 4A performs post-exposure baking (PEB). Moreover, the fifth substrate transport mechanism TM5 transports the substrate W from the post-exposure cleaning unit 162 to the first developing-treatment layer 4A or the second developing-treatment layer 4B alternately.

The developing block 4 performs a developing treatment to the substrate W to which an exposure treatment has been performed, and returns the substrate W to the IF block 6. Specifically, the third substrate transport mechanism TM3 in the developing-treatment layer 4A receives the substrate W from the heating/cooling unit PHP, and transports the received substrate W to the cooling unit CP, the developing unit DEV, the heating/cooling unit PHP, and the substrate platform PS3 in this order (steps S08 to S11). The substrate platform PS3 is disposed between the developing-treatment layer 4A and the IF block 6. Accordingly, the developed substrate W returns to the IF block 6. It should be noted that a process (step S10) by the heating/cooling unit PHP after the treatment by the developing unit DEV is omittable.

The IF block 6 returns the developed substrate W to the carrier C placed on the platform 47 of the opener 45, for example (step S12). That is, the carrier C on the platform 47 includes the opening kept in an opened state by the opener 45. The fourth substrate transport mechanism TM4 returns the substrate W placed on the substrate platform PS3 to the carrier C placed on the opener 45. Specifically, the treated substrate W is returned to the carrier C where the substrate W was accommodated prior to the coating and developing treatments. In other words, the substrate W is returned to the first carrier C. It should be noted that the substrate W is returned to the carrier C on the platform 47 of the opener 46 with use of the fifth substrate transport mechanism TM5.

When all the treated substrates W are accommodated in the carrier C, the opener 45 closes the opening 48 while attaching the lid to the carrier C. The carrier transport mechanism 51 transports the carrier C where the treated substrates W are accommodated from the platform 47 to the output port 72. Thereafter, the external transport mechanism OHT transports the carrier C from the output port 72 to a next target.

Here, the fifth substrate transport mechanism TM5 transports the substrate W directly to the heating/cooling unit PHP in the developing block 4. In this regard, the fifth substrate transport mechanism TM5 may transport the substrate W to the platform such as the feeding substrate buffer SBF3, and the third substrate transport mechanism TM3 may transport the substrate W from the platform to the heating/cooling unit PHP, for example.

Figure 8:
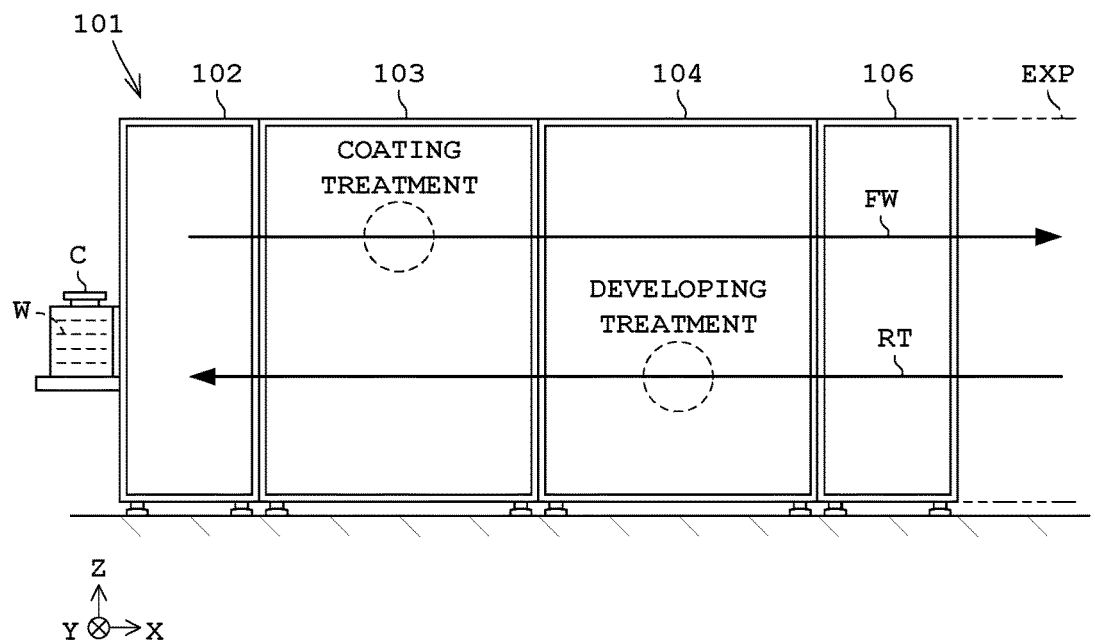
FIG. 8 illustrates operation of a currently-used substrate treating apparatus.

FIG. 8 illustrates operation of a currently-used substrate treating apparatus 101. The currently-used substrate treating apparatus 101 transports a substrate W to an ID block 102, a coating block 103, a developing block 104, and an IF block 106 in this order (forward path FW). At this time, the coating block 103 performs a coating process to the substrate W while the developing block 104 does not perform a developing process to the substrate W. Moreover, the substrate treating apparatus 101 transports the exposed substrate W to the IF block 106, the developing block 104, the coating block 103, and the ID block 102 in this order (return path RT). At this time, the coating block 103 does not perform the coating treatment to the substrate W while the developing block 104 performs the developing treatment to the substrate W.

Figure 9:
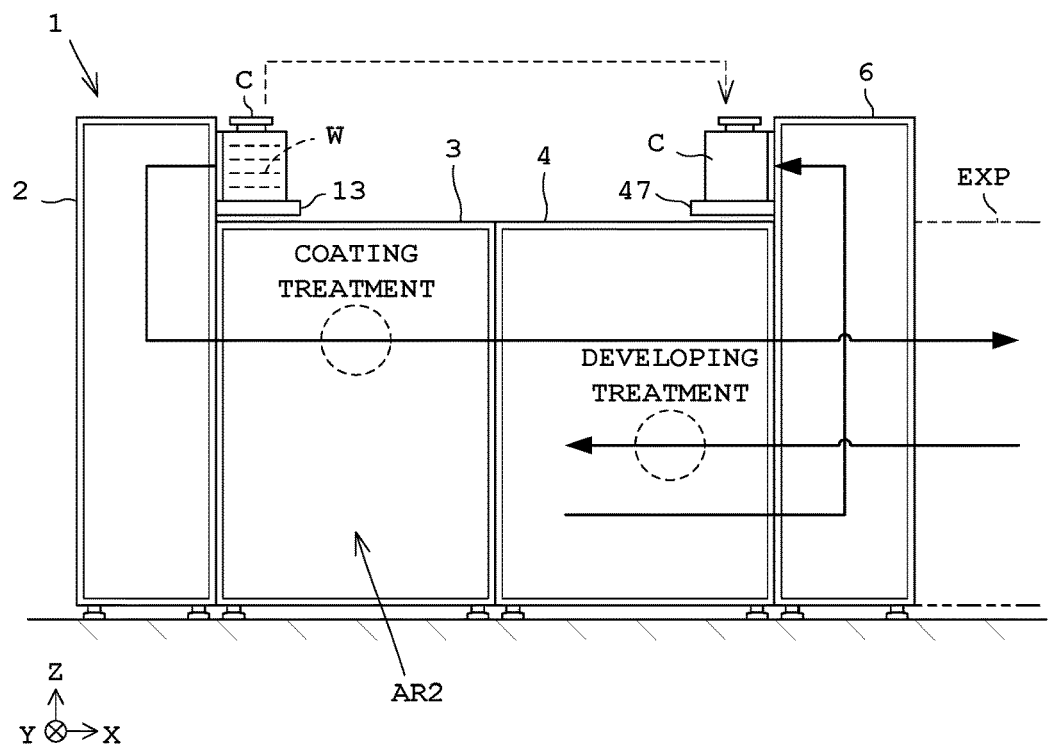
FIG. 9 illustrates operation of the substrate treating apparatus according to the first embodiment.

According to this embodiment, the ID block 2, the coating block 3, the developing block 4, and the IF block 6 are arranged in this order as in FIG. 9. A platform 13 is placed on the ID block 2, and the platform 47 is placed on the IF block 6. Conventionally, as illustrated in FIG. 8, the carrier platform 113 is placed on only the ID block 102. Accordingly, the substrate W is transported in both the forward path FW and the return path RT between the ID block 102 and the IF block 106. According to this aspect of the present invention, the substrate W is transported from the IF block 6 to the developing block 4 in the return path, and thereafter, the substrate W is returned back from the developing block 4 to the IF block 6 without being transported to the coating block 3. Consequently, the transportation process by the coating block 3 in the return path is reduced as illustrated by the arrow AR2 in FIG. 9. That is, one step among the transportation step is reduced. Reduction by one step achieves another step in the transportation process. This increases the transportation speed in the coating block 3. As a result, an entire throughput of the substrate treating apparatus 1 can be enhanced.

Moreover, the IF block 6 includes the cleaning units 161, 162 configured to perform a cleaning treatment as an example of the fourth treatment, the fourth substrate transport mechanism TM4, and the fifth substrate transport mechanism TM5. The fourth substrate transport mechanism TM4 transports a substrate W at least among the developing block 4, a carrier C placed on the platform 47 of the opener 45, and the pre-exposure cleaning unit 161. The fifth substrate transport mechanism TM5 transports a substrate W at least among the developing block 4, the carrier C placed on the platform 47 of the opener 46, and the post-exposure cleaning unit 162.

For instance, the fourth substrate transport mechanism TM4 transports the substrate W not only to the developing block 4 and the pre-exposure cleaning unit 161 but also to the carrier C placed on the platform 47 of the opener 45 provided in the IF block 6. Accordingly, another substrate transport mechanism is not necessarily provided in a direction where the developing block 4 and the IF block 6 are arranged. This achieves a more compact configuration of the IF block 6 than the configuration in FIGS. 10 and 11 mentioned later. As a result, reduction in footprint of the substrate treating apparatus 1 is obtainable.

Moreover, the substrate treating apparatus 1 further includes the carrier transport mechanism 51 configured to transport a carrier C between the platform 13 and the platform 47 as in FIG. 1. For instance, when all the substrates W are taken from the carrier C placed on the platform 13, the carrier transport mechanism 51 is capable of transporting the carrier C placed on the platform 13 to the platform 47 in order to return the substrates W to the carrier C.

Moreover, the carrier transport mechanism 51 is mounted on the coating block 3 and the developing block 4. A currently-used carrier transport mechanism is disposed horizontally with respect to the ID block 102 (i.e., adjacent to the carrier C in FIG. 8). With the configuration of this embodiment, the carrier transport mechanism 51 is mounted on the two treating blocks 3, 4. Accordingly, an installation area of the currently-used carrier transport mechanism disposed horizontally with respect to the ID block 2 can be decreased. In other words, reduction in footprint of the substrate treating apparatus 1 is obtainable.

Moreover, the substrate treating apparatus 1 includes the carrier storage shelf 53 mounted on at least either the coating block 3 or the developing block 4. The carrier transport mechanism 51 transports a carrier C among the platforms 13, 47 and the carrier storage shelf 53. A currently-used carrier storage shelf is disposed horizontally with respect to the ID block 102. With the configuration of this embodiment, the carrier storage shelf 53 is mounted on at least either the coating block 3 or the developing block 4. Accordingly, an installation area of the currently-used carrier storage shelf disposed horizontally with respect to the ID block 102 can be decreased. In other words, reduction in footprint of the substrate treating apparatus 1 is obtainable.

SECOND EMBODIMENT

A second embodiment of the present invention will now be described with reference to the drawings. Here, the description common to that of the first embodiment is to be omitted.

In the first embodiment, the substrate transport mechanism TM4 (TM5) transports a substrate W to the cleaning unit 161 (162) and returns the substrate W to a carrier C placed on the platform 47. In this embodiment, the substrate transport mechanism TM4 (TM5) transports a substrate W to the cleaning unit 161 (162). Then, a seventh substrate transport mechanism TM7 returns the substrate W to a carrier C placed on the opener 47. In other words, substrate transportation performed by the substrate transport mechanism TM4 (TM5) in the first embodiment is shared.

Figure 10:
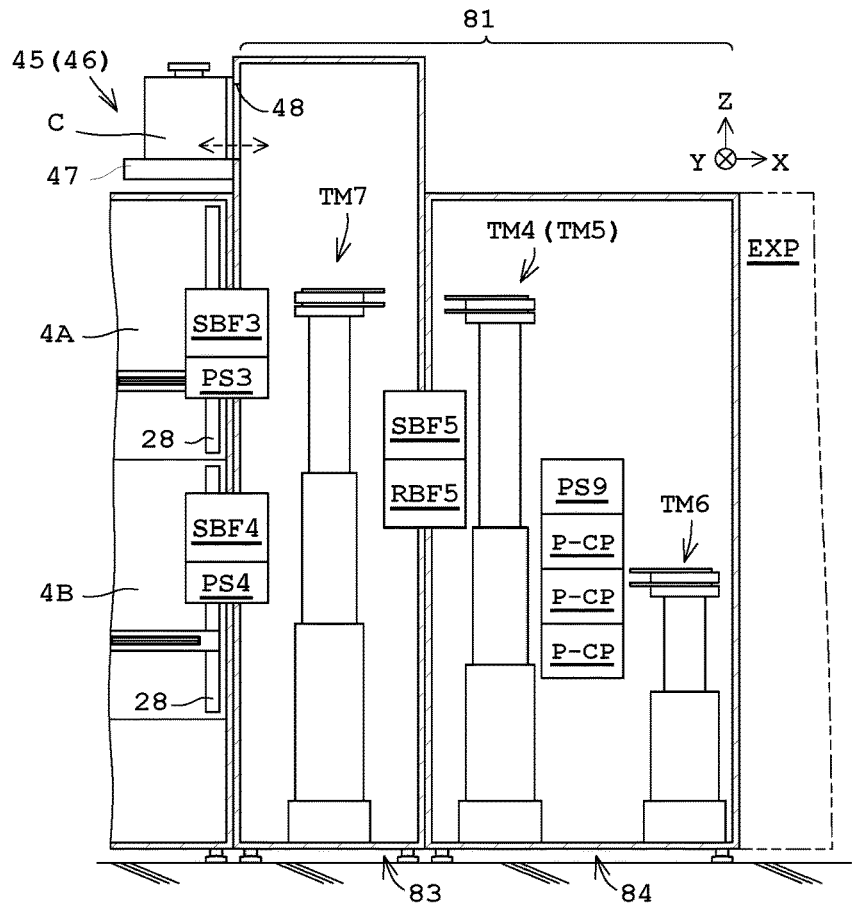
FIG. 10 is a longitudinal cross-sectional view partially illustrating a substrate treating apparatus according to a second embodiment.
Figure 11:
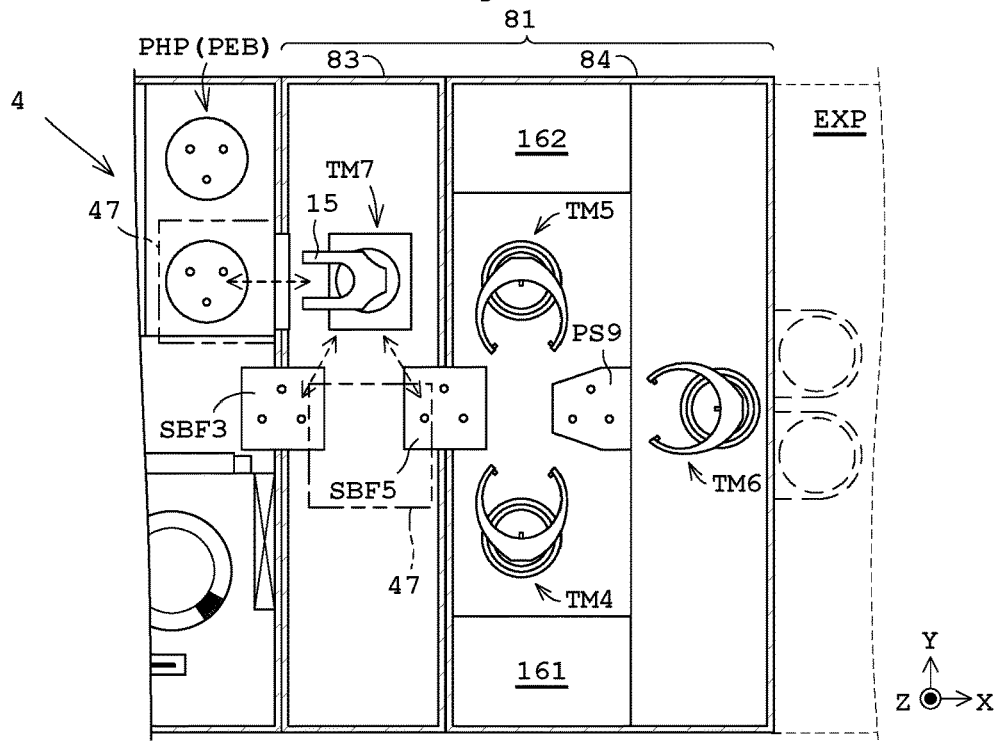
FIG. 11 is a horizontal cross-sectional view partially illustrating the substrate treating apparatus according to the second embodiment.

FIG. 10 is a longitudinal cross-sectional view partially illustrating a substrate treating apparatus 1 according to the second embodiment. FIG. 11 is a horizontal cross-sectional view partially illustrating the substrate treating apparatus 1. An IF block 81 includes a second ID block 83 and an IF body block 84. The second ID block 83 corresponds to the second indexer block in the present invention.

A feeding substrate buffer SBF3 and a substrate platform PS3 are disposed between an upper developing-treatment layer 4A in the developing block 4 and a second ID block 83. A feeding substrate buffer SBF4 and a substrate platform PS4 are disposed between a lower developing-treatment layer 4B in the developing block 4 and a second ID block 83.

A feeding substrate buffer SBF5 and a return substrate buffer RBF5 are disposed between the second ID block 83 and the IF body block 84. The feeding substrate buffer SBF5 and the return substrate buffer RBF5 are disposed in the upward/downward direction. Each of the feeding substrate buffer SBF5 and the return substrate buffer RBF5 is configured to place a plurality of substrates W.

Figure 12:
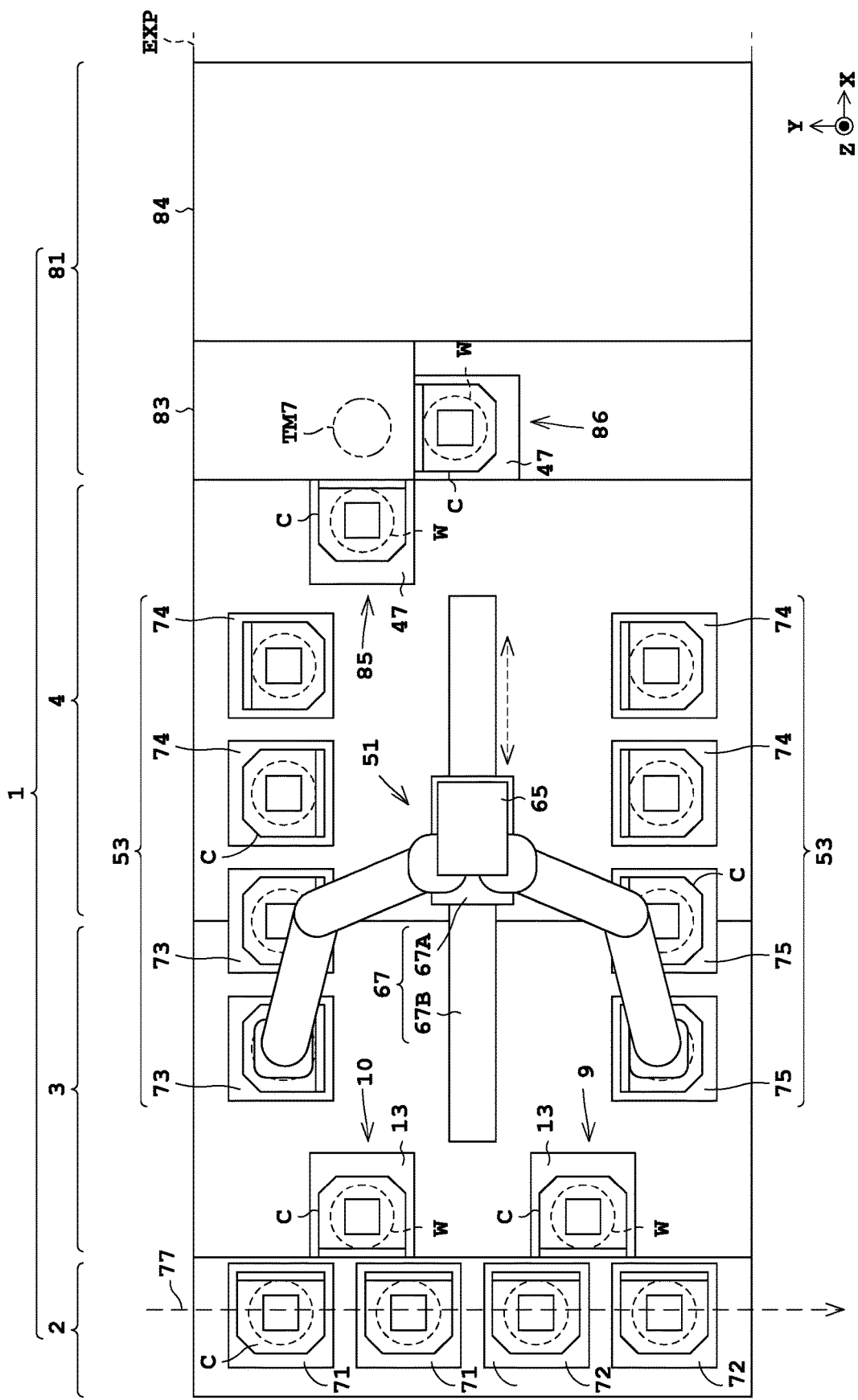
FIG. 12 is a plan view of arrangement of an opener provided in an interface block according to the second embodiment of the present invention.

As illustrated in FIG. 12, two openers 85, 86 are provided on the second ID block 83. Each of the two openers 85, 86 includes a platform 47. The configurations of the openers 85, 86 except the platform 47 are identical to the configuration of the opener 9 (10), and accordingly, the description thereof is to be omitted. The second ID block 83 includes the seventh substrate transport mechanism TM7. The two openers 85, 86 are disposed around the seventh substrate transport mechanism TM7 in plan view. After transporting substrates W to a carrier C on the opener 85, the seventh substrate transport mechanism TM7 is capable of transporting substrate W to a carrier C on the other opener 86. Accordingly, the seventh substrate transport mechanism TM7 is capable of transporting the substrates W successively without any standby time.

Reference is made to FIGS. 10 and 11. The seventh substrate transport mechanism TM7 transports a substrate W among the three feeding substrate buffers SBF3 to SBF5, the return substrate buffer RBF5, the two substrate platforms PS3, PS4, eight in total heating/cooling units PHP arranged adjacent to the second ID block 83 in the upward/downward direction, and carriers C placed on the platform 47 of the openers 85, 86.

The IF body block 84 includes the fourth substrate transport mechanism TM4 and the fifth substrate transport mechanism TM5. The fourth substrate transport mechanism TM4 is capable of transporting a substrate W among the feeding substrate buffer SBF5, the return substrate buffer RBF5, a substrate platform PS9, three mounting-cum-cooling units P-CP, and a pre-exposure cleaning unit 161.

The fifth substrate transport mechanism TM5 is capable of transporting a substrate W among the feeding substrate buffer SBF5, the return substrate buffer RBF5, the substrate platform PS9, the three mounting-cum-cooling units P-CP, and the post-exposure cleaning unit 162. The fourth substrate transport mechanism TM4 and the fifth substrate transport mechanism TM5 are incapable of delivering and receiving the substrate W directly to and from the heating/cooling unit PHP in the developing block 4 and carriers C of the two openers 85, 86.

Here, no opener is provided on the IF body block 84. The configurations of elements except the IF body block 84 are identical to the configuration of the IF block 6 in the first embodiment, and accordingly, the description thereof is to be omitted.

Operation of Substrate Treating Apparatus 1

Figure 13:
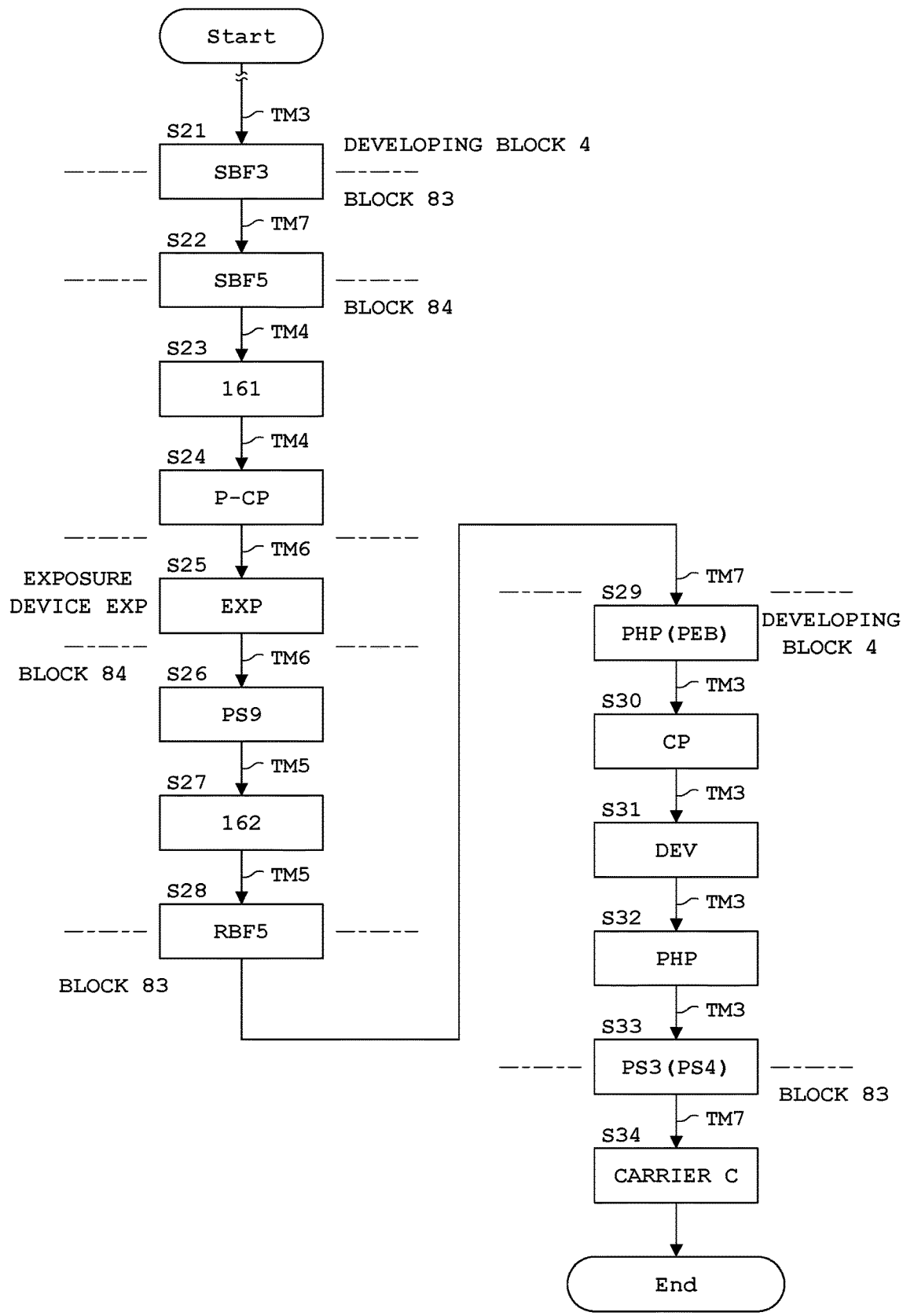
FIG. 13 is a flow chart illustrating operation of the substrate treating apparatus according to the second embodiment.

An operation of the substrate treating apparatus 1 according to this embodiment will now be described. The following describes parts different from the first embodiment. FIG. 13 is a flow chart illustrating operation of the substrate treating apparatus 1 according to the second embodiment.

The third substrate transport mechanism TM3 in the developing block 4 transports the substrate W subjected to the coating treatment to the feeding substrate buffer SBF3, for example (step S21). This allows the developing block 4 to transport the substrate W to the IF block 81.

The second ID block 83 of the IF block 81 transports the substrate W subjected to the coating treatment to an IF body block 84. Specifically, the seventh substrate transport mechanism TM7 receives the substrate W from the feeding substrate buffer SBF3 (SBF4), and transports the received substrate W to the feeding substrate buffer SBF5 (step S22).

The IF body block 84 unloads the substrate W subjected to the coating treatment into the exposure device EXP. Specifically, the fourth substrate transport mechanism TM4 receives the substrate W from the feeding substrate buffer SBF5, and transports the received substrate W to the pre-exposure cleaning unit 161 and the mounting-cum-cooling unit P-CP in this order (steps S23, S24). The sixth substrate transport mechanism TM6 transports the substrate W from the mounting-cum-cooling unit P-CP to the exposure device EXP. The exposure device EXP performs the exposure treatment to the transported substrate W (step S25).

The IF body block 84 loads the substrate W subjected to the exposure treatment from the exposure device EXP. Thereafter, the IF body block 84 transports the substrate W subjected to the cleaning treatment in the post-exposure cleaning unit 162 to the second ID block 83, for example. In other words, the sixth substrate transport mechanism TM6 transports the substrate W exposed by the exposure device EXP from the exposure device EXP to the substrate platform PS9 (step S26). The fifth substrate transport mechanism TM5 receives the substrate W from the substrate platform PS9, and transports the received substrate W to the post-exposure cleaning unit 162 (step S27). Thereafter, the fifth substrate transport mechanism TM5 transports the substrate W subjected to the cleaning treatment in the post-exposure cleaning unit 162 to the return substrate buffer RBF5 (step S28).

The second ID block 83 transports the substrate W subjected to the exposure treatment and the cleaning treatment to the developing block 4. In other words, the seventh substrate transport mechanism TM7 receives the substrate W from the return substrate buffer RBF5. Thereafter, the seventh substrate transport mechanism TM7 transports the received substrate W directly to the heating/cooling unit PHP in the developing-treatment layer 4A (4B) of the developing block 4 (step S29).

The developing block 4 performs a developing treatment to the substrate W to which the exposure treatment and the cleaning treatment has been performed, and returns the substrate W to the IF block 81. Specifically, the third substrate transport mechanism TM3 in the developing-treatment layer 4A (4B) receives the substrate W from the heating/cooling unit PHP, and transports the received substrate W to a cooling unit CP, a developing unit DEV, the heating/cooling unit PHP, and the substrate platform PS3 (PS4) in this order (steps S30 to S33). The substrate platform PS3 (PS4) is disposed between the developing block 4 and the second ID block 83. Accordingly, the developed substrate W returns to the second ID block 83.

The second ID block 83 returns the developed substrate W to a carrier C on the platform 47 of the opener 85 (86). That is, the carrier C placed on the platform 47 includes the opening kept in an opened state by the opener 45. The seventh substrate transport mechanism TM7 returns the substrate W placed on the substrate platform PS3 (PS4) to the carrier C placed on the opener 85 (86) (step S34).

According to this embodiment, the IF block 81 includes the second ID block 83 where the platform 47 is provided and the IF body block 84. The seventh substrate transport mechanism TM7 in the second ID block 83 is capable of taking and accommodating the substrate W from and into the carrier C on the platform 47. Accordingly, the fourth substrate transport mechanism TM4 of the IF body block 84, for example, does not necessarily take or accommodate the substrate W from and into the carrier C on the platform 47. That is, transportation operation can be shared with the three substrate transport mechanisms TM4, TM5, TM7, and thus a decrease in throughput of the substrate treating apparatus 1 can be prevented.

Here in FIG. 11, the second ID block 83 includes one substrate transport mechanism TM7. In this regard, the second ID block 83 may include two substrate transport mechanisms TM7, TM8. In such a case above, the two substrate transport mechanisms TM7, TM8 may each transport a substrate W into the carrier C placed on the platform 47 of the opener and may transport the substrate W between the developing block 4 and the IF body block 84. Moreover, the seventh substrate transport mechanism TM7 may each be used to transport the substrate W into the carrier C placed on the platform 47 of the opener and the eighth substrate transport mechanism TM8 may be used to transport the substrate W between the developing block 4 and the IF body block 84. It should be noted that tasks of the two substrate transport mechanisms TM7, TM8 are replaceable with each other.

THIRD EMBODIMENT

A third embodiment of the present invention will now be described with reference to the drawings. Here, the description common to that of the first and second embodiments is to be omitted.

In the first embodiment, the IF block 6 includes the cleaning units 161, 162 as a treating unit. In this embodiment, the IF block 6 includes a heating/cooling unit PHP (PEB) in addition to the cleaning units 161, 162.

Figure 14:
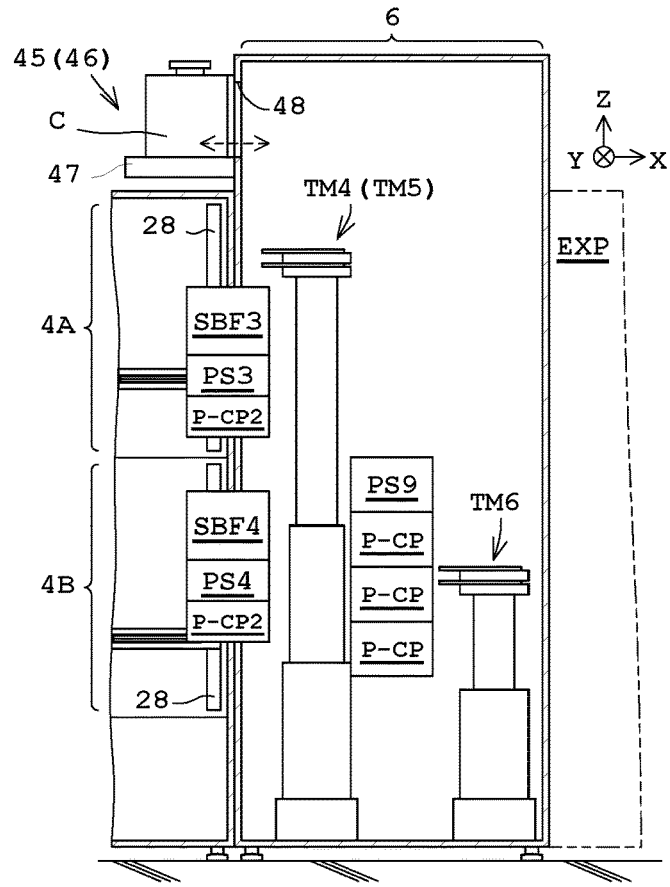
FIG. 14 is a longitudinal cross-sectional view partially illustrating a substrate treating apparatus according to a third embodiment.
Figure 15:
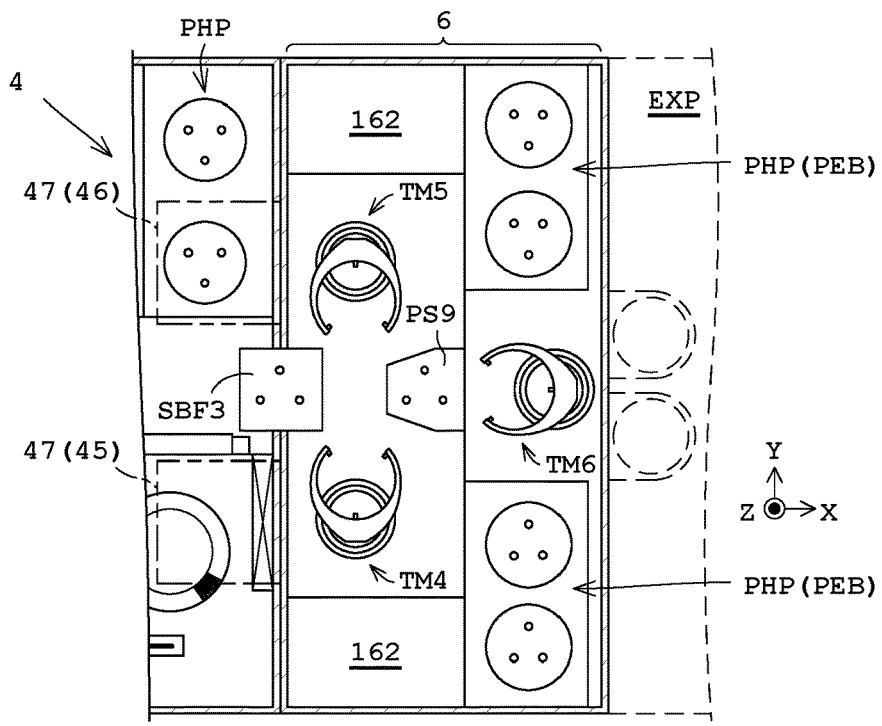
FIG. 15 is a horizontal cross-sectional view partially illustrating the substrate treating apparatus according to the third embodiment.
Figure 16:
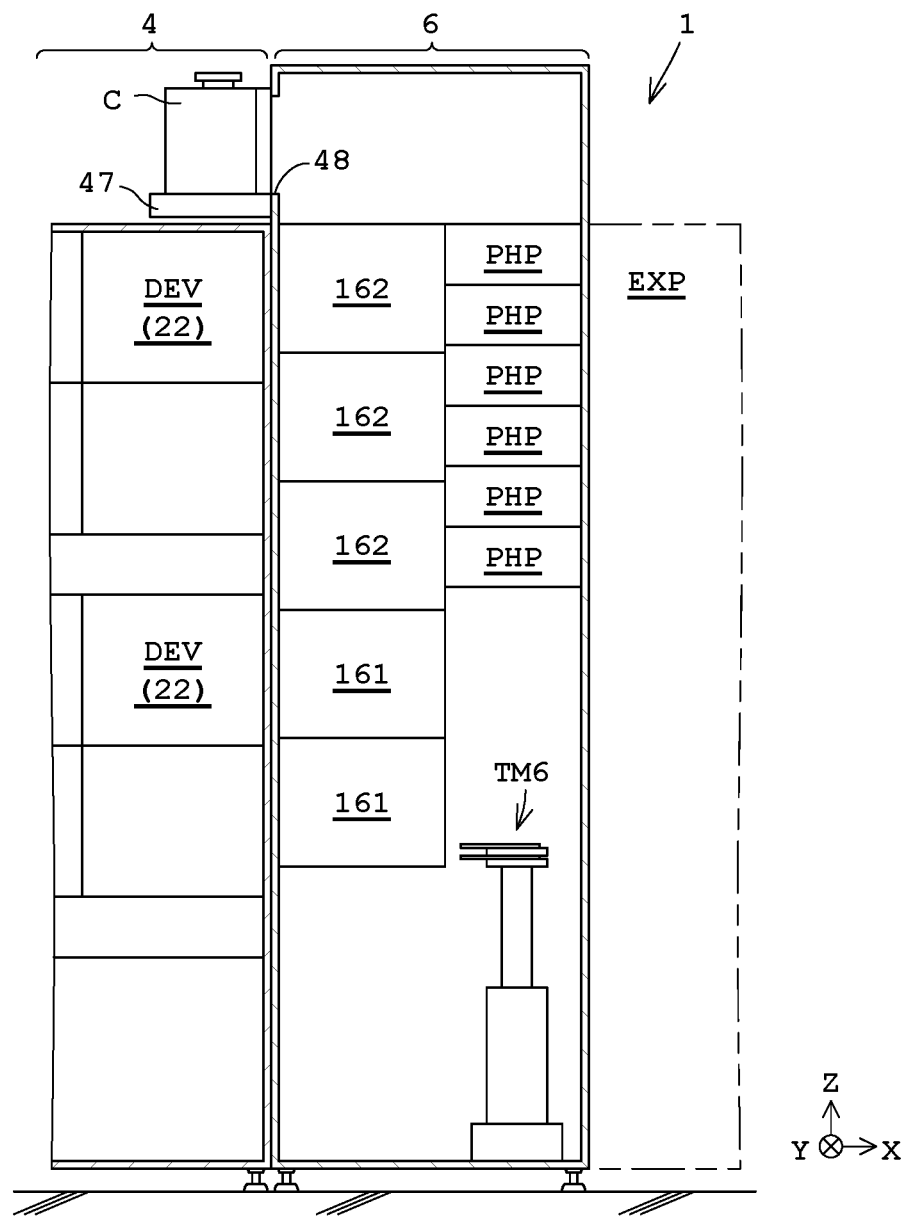
FIG. 16 is a right side view partially illustrating the substrate treating apparatus according to the third embodiment.

FIG. 14 is a longitudinal cross-sectional view partially illustrating a substrate treating apparatus 1 according to the third embodiment. FIG. 15 is a horizontal cross-sectional view partially illustrating the substrate treating apparatus 1. FIG. 16 is a right side view partially illustrating the substrate treating apparatus 1.

In FIG. 14, a mounting-cum-cooling unit P-CP2 is disposed, in addition to a feeding substrate buffer SBF3 and a substrate platform PS3, between a developing-treatment layer 4A and the IF block 6. Likewise, a mounting-cum-cooling unit P-CP2 is disposed, in addition to the feeding substrate buffer SBF4 and a substrate platform PS4, between a developing-treatment layer 4B and the IF block 6.

As illustrated in FIGS. 15 and 16, the IF block 6 includes heating/cooling units PHP (PEB) in addition to the cleaning units 161, 162. The heating/cooling units PHP in the IF block 6 are provided to face the sixth substrate transport mechanism TM6. As illustrated in FIG. 16, six heating/cooling units PHP are arranged adjacent to the fourth substrate transport mechanism TM4 (see FIG. 15) in the upward/downward direction. Moreover, six heating/cooling units PHP are also arranged adjacent to the fifth substrate transport mechanism TM5 (see FIG. 15) in the upward/downward direction.

As illustrated in FIG. 15, the IF block 6 includes the cleaning units 161, 162 and the heating/cooling units PHP in such a manner as to be symmetric with respect to the Y-direction. Accordingly, the fourth substrate transport mechanism TM4 is capable of transporting a substrate W among the two feeding substrate buffers SBF3, SBF4, the three substrate platforms PS3, PS4, PS9, the five mounting-cum-cooling units P-CP, P-CP2, the cleaning units 161, 162, the heating/cooling units PHP in the IF block 6, and a carrier C placed on the opener 45.

The fifth substrate transport mechanism TM5 is capable of transporting a substrate W among the two feeding substrate buffers SBF3, SBF4, the three substrate platforms PS3, PS4, PS9, the five mounting-cum-cooling units P-CP, P-CP2, the cleaning units 161, 162, the heating/cooling units PHP in the IF block 6, and a carrier C placed on the opener 46.

Operation of Substrate Treating Apparatus 1

Figure 17:
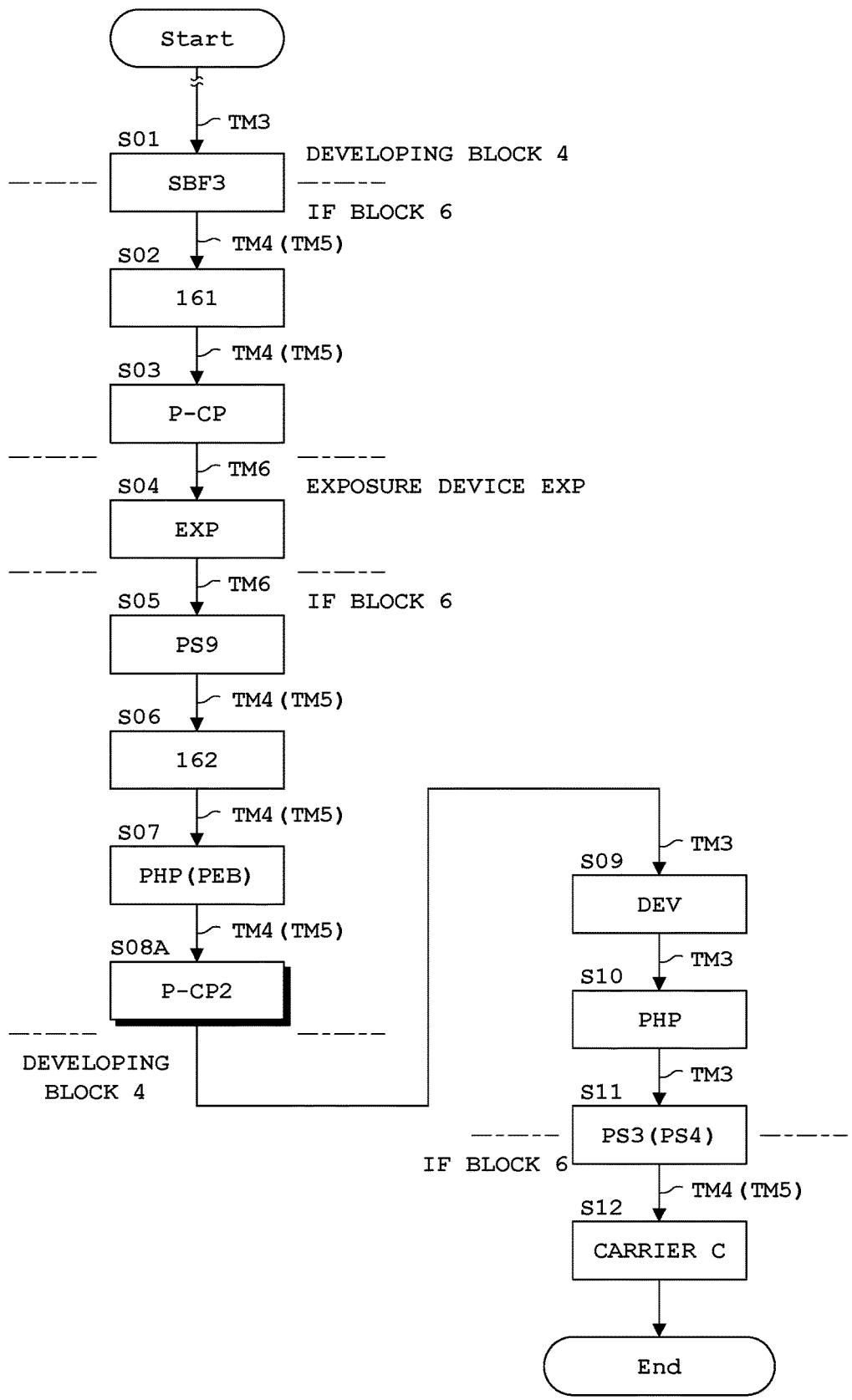
FIG. 17 is a flow chart illustrating operation of the substrate treating apparatus according to the third embodiment.

An operation of the substrate treating apparatus 1 according to this embodiment will now be described. FIG. 17 is a flow chart illustrating operation of the substrate treating apparatus 1 according to the third embodiment. The following describes parts different from operation in the first embodiment illustrated in FIG. 7.

In step S06, the substrate transport mechanism TM4 (TM5) transports the substrate W to the post-exposure cleaning unit 162. The substrate transport mechanism TM4 (TM5) transports the substrate W subjected to the cleaning treatment in the post-exposure cleaning unit 162 to the heating/cooling unit PHP in the IF block 6 (step S07). Moreover, the substrate transport mechanism TM4 (TM5) transports the substrate W subjected to the baking after the exposure in the heating/cooling unit PHP to the mounting-cum-cooling unit P-CP2 (step S08A). Thereafter, the IF block 6 loads the substrate W subjected to the exposure treatment from the exposure device EXP and transports the substrate W subjected to the exposure treatment to the developing block 4.

Specifically, the third substrate transport mechanism TM3 in the developing-treatment layer 4B in the developing block 4, for example, receives the substrate W from the mounting-cum-cooling unit P-CP2 in FIG. 14, and transports the received substrate W to the developing unit DEV, the heating/cooling unit PHP, and the substrate platform PS4, for example, in this order (steps S09 to S11). The substrate platform PS4 is disposed between the developing-treatment layer 4B and the IF block 6. Accordingly, the developed substrate W returns to the IF block 6.

In the IF block 6, the fourth substrate transport mechanism TM4 returns the substrate W placed on the substrate platform PS4 to a carrier C placed on the opener 45 (step S12). It should be noted that the substrate W is returned to the carrier C placed on the platform 47 of the opener 46 with use of the fifth substrate transport mechanism TM5.

This embodiment produces the same effect as that of the first embodiment. That is, this embodiment achieves an enhanced throughput of the substrate treating apparatus 1. Moreover, a compact configuration of the IF block 6 is obtainable, leading to reduction in footprint of the substrate treating apparatus 1.

FOURTH EMBODIMENT

A fourth embodiment of the present invention will now be described with reference to the drawings. Here, the description common to that of the first to third embodiments is to be omitted.

In the second embodiment, the IF block 81 includes the cleaning units 161, 162 as a treating unit. In this embodiment, the IF block 6 includes a heating/cooling unit PHP (PEB) in addition to the cleaning units 161, 162.

Figure 18:
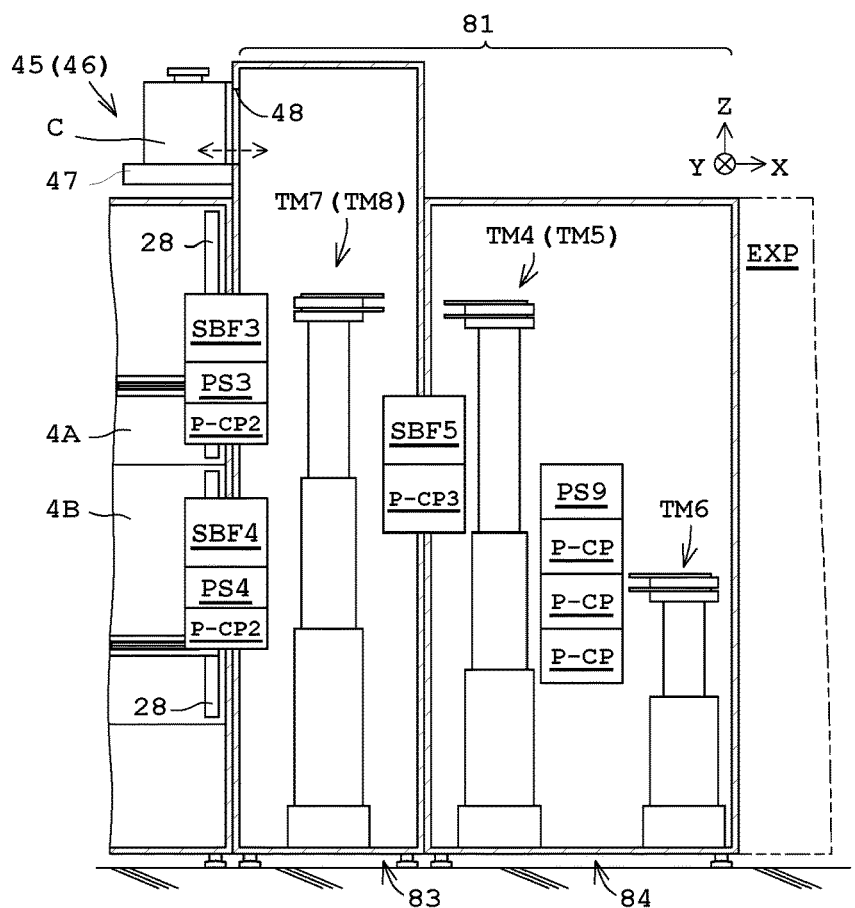
FIG. 18 is a longitudinal cross-sectional view partially illustrating a substrate treating apparatus according to a fourth embodiment.
Figure 19:
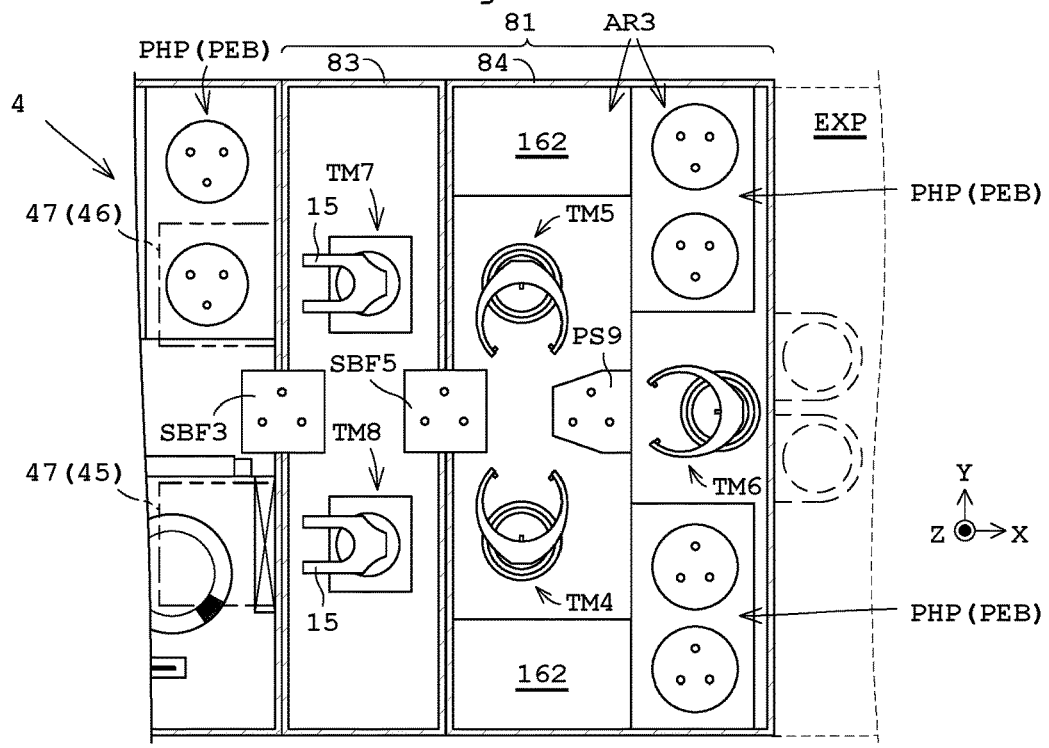
FIG. 19 is a horizontal cross-sectional view partially illustrating the substrate treating apparatus according to the fourth embodiment.
Figure 20:
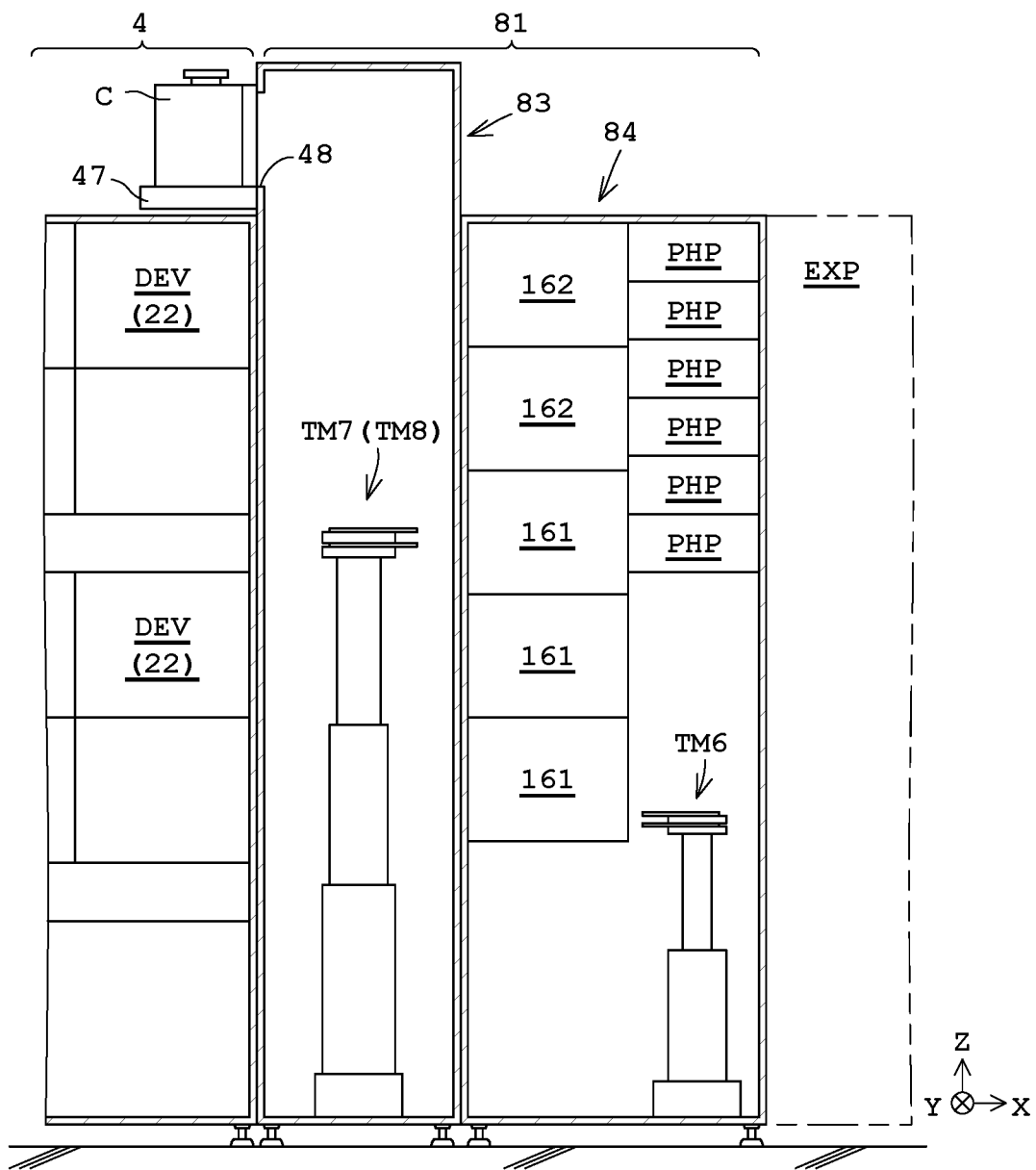
FIG. 20 is a right side view partially illustrating the substrate treating apparatus according to the fourth embodiment.

FIG. 18 is a longitudinal cross-sectional view partially illustrating a substrate treating apparatus 1. FIG. 19 is a horizontal cross-sectional view partially illustrating the substrate treating apparatus 1. FIG. 20 is a right side view partially illustrating the substrate treating apparatus 1.

In FIG. 18, instead of the return substrate buffer RBF5 in FIG. 10, a mounting-cum-cooling unit P-CP3 is provided. Moreover, mounting-cum-cooling units P-CP2 are provided between two developing-treatment layers 4A, 4B and a second ID block 83.

As illustrated in FIG. 19, the IF body block 84 includes heating/cooling units PHP (PEB) in addition to the cleaning units 161, 162. The configuration of the heating/cooling unit PHP in the IF body block 84 is identical to the configuration of the heating/cooling unit PHP in the IF block 6 in the third embodiment, and accordingly, the description thereof is to be omitted.

A fourth substrate transport mechanism TM4 and a fifth substrate transport mechanism TM5 are each capable of transporting a substrate W among a feeding substrate buffer SBF5, a substrate platform PS9, four mounting-cum-cooling units P-CP, P-CP3, the cleaning units 161, 162, and the heating/cooling unit PHP of the IF body block 84.

Moreover, the fourth substrate transport mechanism TM4 and the fifth substrate transport mechanism TM5 are incapable of delivering and receiving the substrate W to and from carriers C of the two openers 45, 46 in the second ID block 83.

The second ID block 83 includes an eighth substrate transport mechanism TM8 in addition to a seventh substrate transport mechanism TM7. The eighth substrate transport mechanism TM8 is configured in the same manner as that of the first substrate transport mechanism TM1, for example.

The seventh substrate transport mechanism TM7 transports a substrate W among the three feeding substrate buffers SBF3 to SBF5, the three mounting-cum-cooling units P-CP2, P-CP3, the two substrate platforms PS3, PS4, and a carrier C placed on the opener 46.

The eighth substrate transport mechanism TM8 transports a substrate W among the three feeding substrate buffers SBF3 to SBF5, the three mounting-cum-cooling units P-CP2, P-CP3, the two substrate platforms PS3, PS4, and the carrier C placed on the opener 45.

Operation of Substrate Treating Apparatus 1

Figure 21:
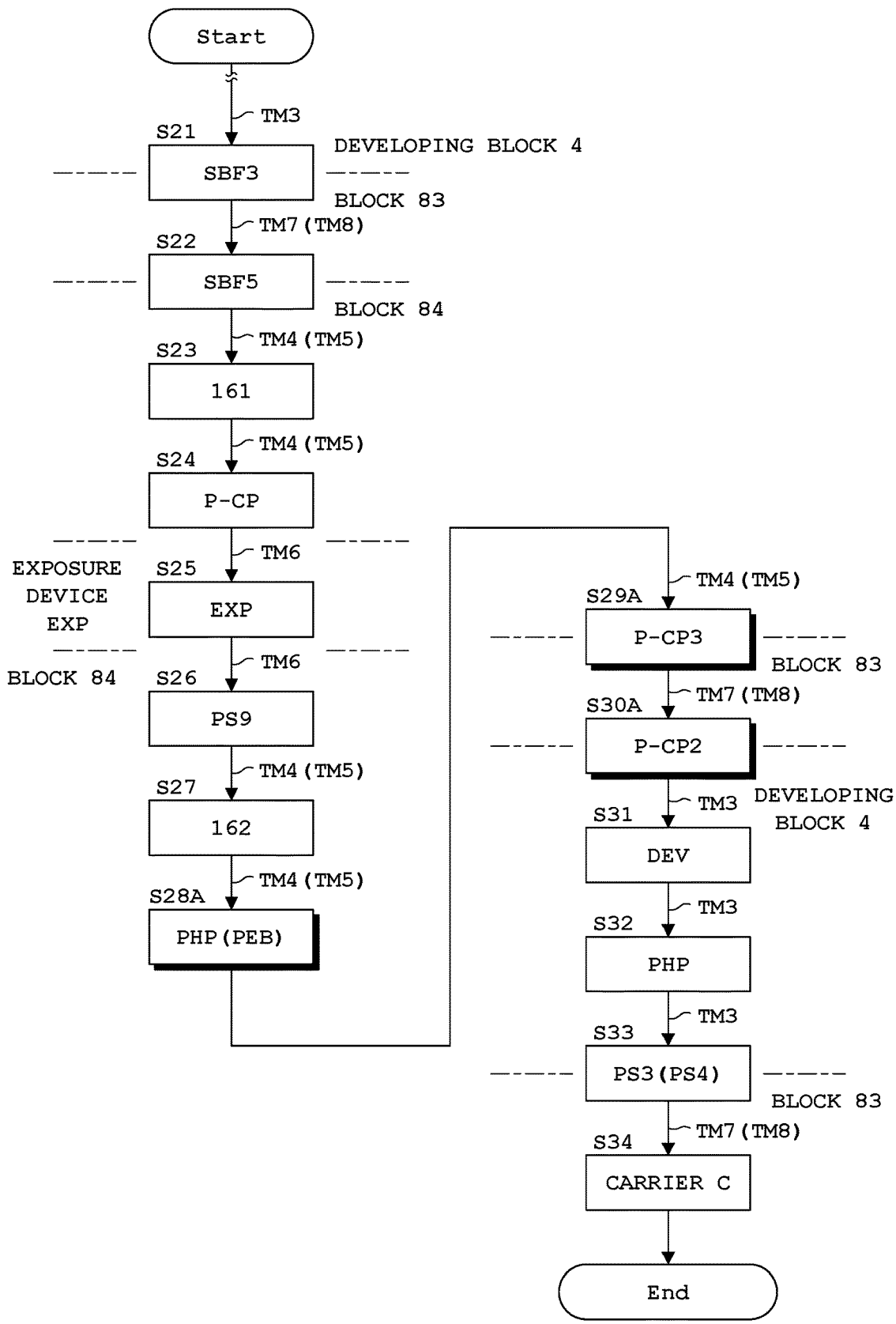
FIG. 21 is a flow chart illustrating operation of the substrate treating apparatus according to the fourth embodiment.

An operation of the substrate treating apparatus 1 according to this embodiment will now be described. FIG. 21 is a flow chart illustrating operation of the substrate treating apparatus according to the fourth embodiment. The following describes parts different from operation in FIG. 13 of the second embodiment.

In step S27, the substrate transport mechanism TM4 (TM5) transports the substrate W to the post-exposure cleaning unit 162. Thereafter, the substrate transport mechanism TM4 (TM5) transports the substrate W subjected to the cleaning treatment in a post-exposure cleaning unit 162 to a heating/cooling unit PHP in the IF block 6 (step S28A). The substrate transport mechanism TM4 (TM5) transports the substrate W subjected to the baking after the exposure in the heating/cooling unit PHP to the mounting-cum-cooling unit P-CP3 (see FIG. 18) (step S29A).

As illustrated in FIG. 18, the substrate transport mechanism TM7 (TM8) transports the substrate W from the mounting-cum-cooling unit P-CP3 to the mounting-cum-cooling unit P-CP2 (step S30A). Accordingly, the IF block 81 loads the substrate W subjected to the exposure treatment from the exposure device EXP and transports the substrate W subjected to the exposure treatment to the developing block 4.

The third substrate transport mechanism TM3 in the developing-treatment layer 4A in the developing block 4, for example, receives the substrate W from the mounting-cum-cooling unit P-CP2 in FIG. 18, and transports the received substrate W to the developing unit DEV, the heating/cooling unit PHP, and the substrate platform PS3 in this order (steps S31 to S33). The substrate platform PS3 is disposed between the developing-treatment layer 4A and the IF block 81. Accordingly, the developed substrate W returns to the IF block 81.

In the second ID block 83, the eighth substrate transport mechanism TM8 returns the substrate W placed on the substrate platform PS4 to a carrier C placed on the platform 47 of the opener 45 (step S34). It should be noted that the substrate W is returned to the carrier C placed on the platform 47 of the opener 46 with use of the seventh substrate transport mechanism TM7.

This embodiment produces the same effect as that of the first embodiment. That is, this embodiment achieves an enhanced throughput of the substrate treating apparatus 1. Moreover, taking and accommodating the substrate W from and into the carriers C placed on the platform 47 can be shared with the other substrate transport mechanisms TM7, TM8.

Here in FIG. 19, the second ID block 83 includes the two substrate transport mechanisms TM7, TM8. In this regard, the second ID block 83 includes one substrate transport mechanism TM7.

Moreover, the following configuration is adoptable when the second ID block 83 includes two substrate transport mechanisms TM7, TM8. Specifically, the two substrate transport mechanisms TM7, TM8 may each transport the substrate W into the carrier C placed on the platform 47 of the opener and may transport the substrate W between the developing block 4 and the IF body block 84. Moreover, the seventh substrate transport mechanism TM7 may be used to transport the substrate W into the carrier C placed on the platform 47 of the opener and the eighth substrate transport mechanism TM8 may be used to transport the substrate W between the developing block 4 and the IF body block 84. It should be noted that such tasks of are replaceable with each other.

FIFTH EMBODIMENT

A fifth embodiment of the present invention will now be described with reference to the drawings. Here, the description common to that of the first to fourth embodiments is to be omitted.

In the first to fourth embodiments, the apparatus 1 takes a substrate W from the carrier C placed on the platform 13 of the ID block 2 illustrated on the left side of FIG. 1, and accommodates the substrate W into the carrier C placed on the platform 47 of the IF block 6 illustrated on the right side of FIG. 1. In this regard, such tasks of are replaceable with each other. That is, the apparatus 1 may take a substrate W from the carrier C placed on the platform 47 of the IF block 6 illustrated on the right side of FIG. 1, and may accommodate the substrate W into the carrier C placed on the platform 13 of the ID block 2 illustrated on the left side of FIG. 1.

Figure 22:
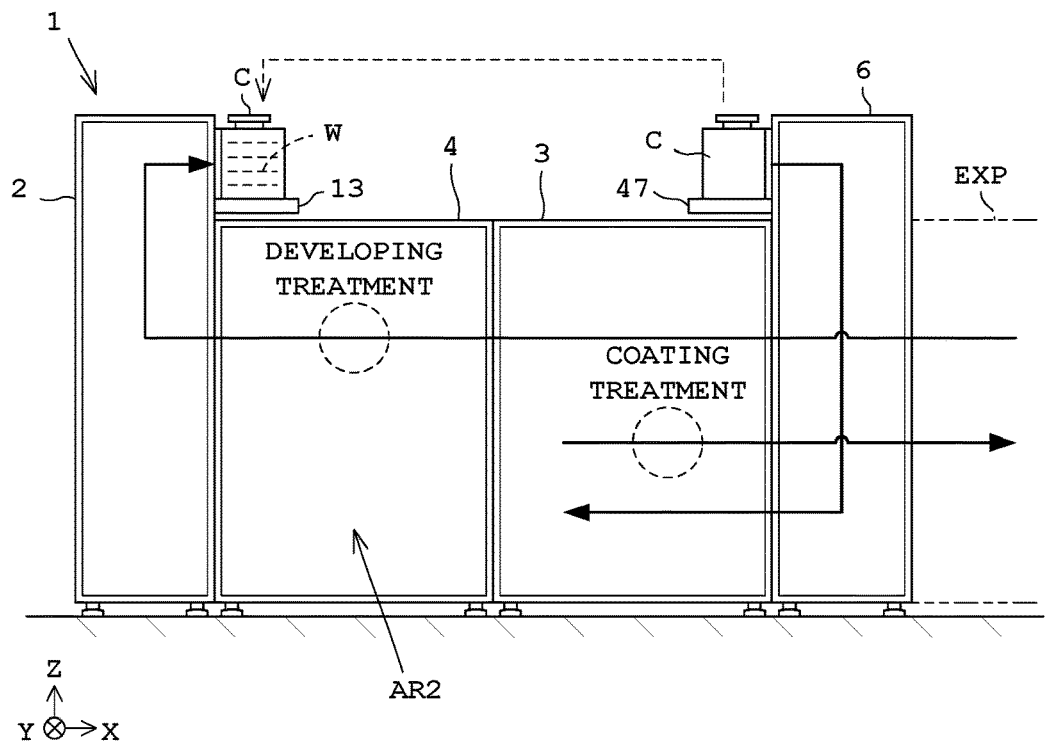
FIG. 22 illustrates operation of the substrate treating apparatus.

FIG. 22 illustrates operation of the substrate treating apparatus 1. The substrate treating apparatus 1 according to this embodiment includes a coating block 3 and a developing block 4 of whose arrangement is reversed manner from that of the substrate treating apparatus 1 in FIG. 1. Moreover, the coating block 3 and the developing block 4 are each configured in one treatment layer corresponding to the coating-treatment layer 3A and the developing-treatment layer 4A in FIG. 1, for example. The substrate treating apparatus 1 in this embodiment includes substantially the same configuration as that of the substrate treating apparatus 1 in any of the first to fourth embodiments.

Here in this embodiment, the developing block 4 corresponds to the first treating block of the present embodiment. Moreover, the developing treatment corresponds to the first treatment in the present invention. The coating block 3 corresponds to the second treating block in the present invention. Moreover, the coating treatment corresponds to the second treatment in the present invention.

Operation of Substrate Treating Apparatus 1

An operation of the substrate treating apparatus 1 according to this embodiment will now be described. Reference is made to FIG. 22. The IF block 6 takes a substrate W from the carrier C placed on the carrier platform 47 of any of two openers 45, 46, and transports the taken substrate W to the coating block 3.

Thereafter, the coating block 3 performs a coating treatment on the substrate W sent from the IF block 6. Thereafter, the coating block 3 returns the substrate W subjected to the coating treatment to the IF block 6. Thereafter, the IF block 6 unloads the substrate W subjected to the coating treatment into the exposure device EXP.

Thereafter, the IF block 6 loads the substrate W subjected to the exposure treatment in the exposure device EXP from the exposure device EXP, and transports the substrate W subjected to the exposure treatment to the coating block 3. The coating block 3 transports the substrate W, sent from the IF block 6 and subjected to the exposure treatment, to the developing block 4. The developing block 4 performs the developing treatment to the substrate W subjected to the exposure treatment, and transports the developed substrate W to the ID block 2. The ID block 2 returns the developed substrate W to the carrier C placed on the platform 13 on either of the two openers 9, 10.

According to this embodiment, the platform 13 is placed on the ID block 2, and the platform 47 is placed on the IF block 6. A currently-used carrier platform is provided only on an ID block. Accordingly, the substrate is transported in both the forward path and the return path between the ID block and the IF block. According to this embodiment, the substrate W is transported from the IF block 6 to the coating block 3, and thereafter, the substrate W returns back from the coating block 3 to the IF block 6. This reduces the number of transportation process by the developing block 4, leading to increase in transportation speed of the developing block 4. As a result, an entire throughput of the substrate treating apparatus 1 can be enhanced.

This invention is not limited to the foregoing examples, but may be modified as follows.

(1) In the first and second embodiments described above, the fifth substrate transport mechanism TM5 or the seventh substrate transport mechanism TM7 transports the substrate W directly to the heating/cooling unit PHP in the developing-treatment layer 4A (4B) of the developing block 4. In this regard, the substrate transport mechanisms TM5, TM7 may each transport the substrate W to the heating/cooling unit PHP via the platform such as the feeding substrate buffer SBF3 and the substrate platform PS3, for example.

Figure 23:
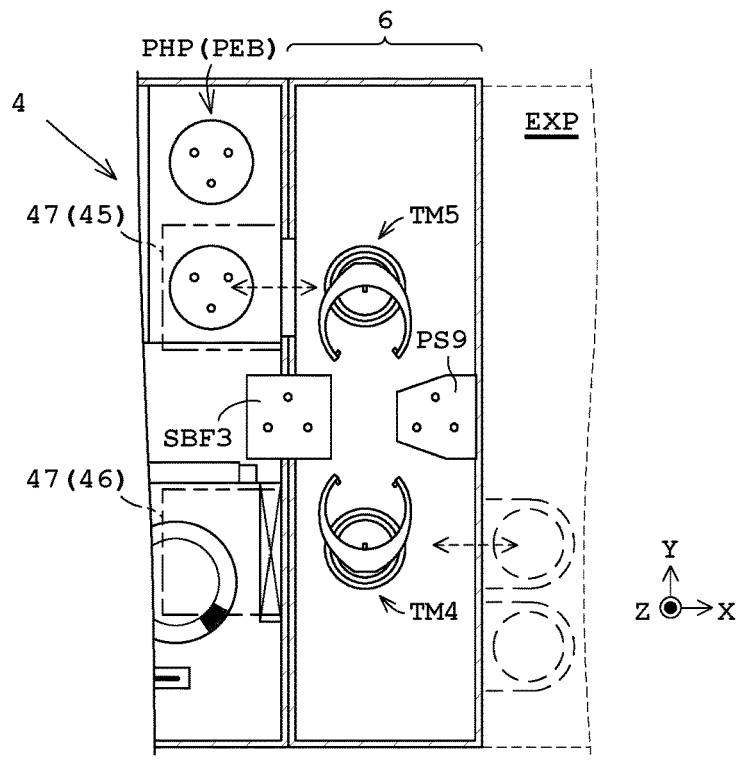
FIG. 23 is a horizontal cross-sectional view partially illustrating a substrate treating apparatus according to one modification of the present invention.

(2) In each of the foregoing examples and modification (1), the IF blocks 6, 81 each include the pre-exposure cleaning unit 161 and the post-exposure cleaning unit 162. In this regard, the IF blocks 6, 81 may include neither the pre-exposure cleaning unit 161 nor the post-exposure cleaning unit 162 as in FIG. 23. As illustrated in FIG. 23, in this case, the sixth substrate transport mechanism TM6 is not necessarily disposed. Moreover, the fourth substrate transport mechanism TM4 may transport the substrate W to the exposure device EXP.

(3) In the above embodiments and modifications, the resist film is formed on the substrate W to which the nozzles supply the resist liquid, and the substrate W is transported to the exposure device EXP while keeping its condition. In this regard, a resist cover film may be formed on the resist film on the substrate W. In FIG. 3, each of the two developing-treatment layers 4A, 4B in the developing block 4 may each include two coating units 91.

The coating unit 91 includes a holding rotation portion 31 that holds and rotates the substrate W, and coating nozzles 32 that dispense a treating liquid for the resist cover film. The coating unit 91 of the developing block 4 causes the nozzles 32 to dispense the treating liquid to the substrate W to which a resist coating treatment has been performed, thereby forming the resist cover film on the resist film of the substrate W. The developing block 4 may send the substrate W, on which the resist cover film is formed, to the IF block 6. The resist cover film is removed by the developing unit DEV.

(4) In the above embodiments and modifications, the coating block 3 and the developing block 4 are each formed by two layers (e.g., the two coating-treatment layers 3A, 3B). In this regard, the coating block 3 and the developing block 4 may each be formed by one layer, or three or more layers.

(5) In the above embodiments and modifications, the ID block 2 includes the two substrate transport mechanisms TM1, TM2. In this regard, the ID block 2 may include one substrate transport mechanism. In this case, the one substrate transport mechanism may take and accommodate the substrates W from and into the carriers C placed on the openers such as the openers 85, 86 in FIG. 12. Alternatively, the one substrate transport mechanism may take and accommodate a substrate W from and into a carrier C placed on one opener. Alternatively, the one substrate transport mechanism may be movable in the Y-direction by a drive mechanism. The substrate transport mechanism movable in the Y-direction may take and accommodate substrates W from and into the carriers C placed on a plurality of (e.g., four) openers arranged in the Y-direction.

(6) In the above embodiments and modifications, the IF blocks 6, 81 may be configured as under. For instance, the pre-exposure cleaning unit 161 is disposed adjacent to the fourth substrate transport mechanism TM4, and the post-exposure cleaning unit 162 is disposed adjacent to the fifth substrate transport mechanism TM5 in FIGS. 2 to 4. In other words, the two types of cleaning units 161, 162 are arranged asymmetrically in the Y-direction. In this regard, the three pre-exposure cleaning units 161 and the two post-exposure cleaning units 162 may be disposed on both sides adjacent to the fourth substrate transport mechanism TM4 and the fifth substrate transport mechanism TM5 as in FIGS. 19 and 20.

Moreover, the three pre-exposure cleaning units 161 and the two post-exposure cleaning units 162 are disposed on both sides adjacent to the fourth substrate transport mechanism TM4 and the fifth substrate transport mechanism TM5 in FIGS. 19, 20. In other words, the two types of cleaning units 161, 162 are arranged symmetrically in the Y-direction. In this regard, the pre-exposure cleaning unit 161 may be disposed adjacent to the fourth substrate transport mechanism TM4, and the post-exposure cleaning unit 162 may be disposed adjacent to the fifth substrate transport mechanism TM5 as in FIGS. 2 to 4.

(7) In the above embodiments and modifications, the substrate treating apparatus 1 includes the two treating blocks (coating block 3 and developing block 4). In this regard, the substrate treating apparatus 1 may include three or more treating blocks.

Figure 24:
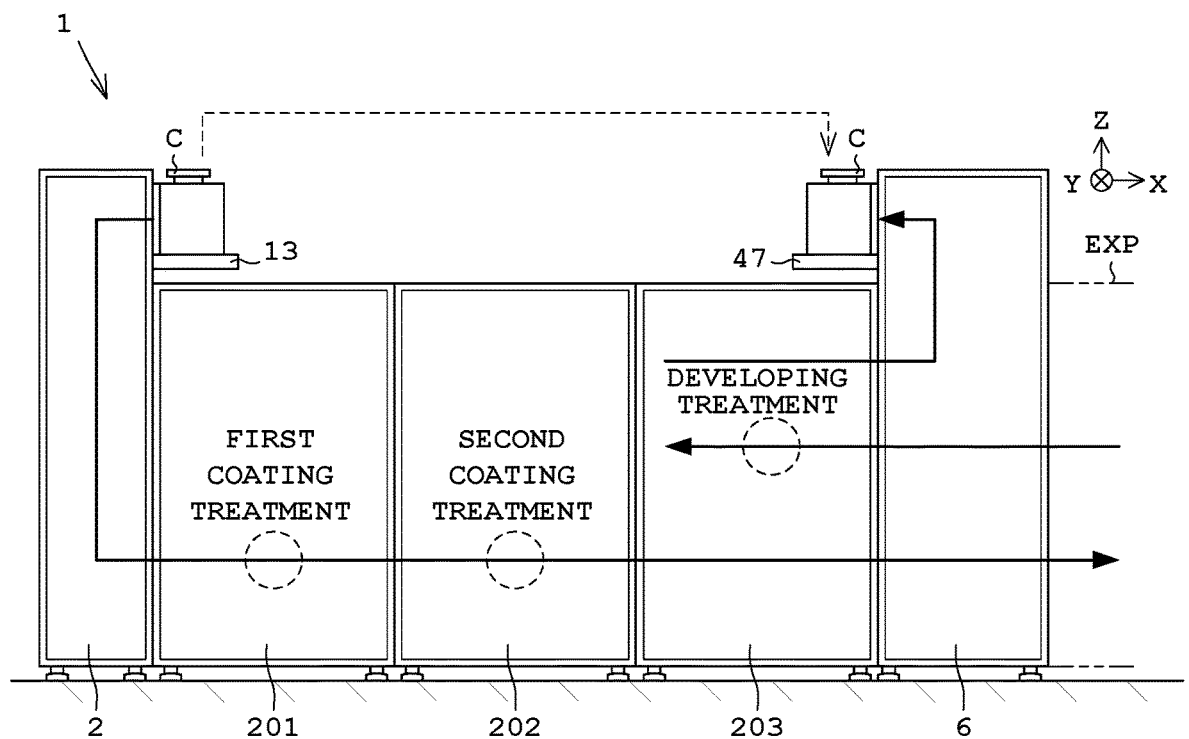
FIG. 24 illustrates a configuration and operation of a substrate treating apparatus according to another modification of the present invention.

First, the following describes a substrate treating apparatus 1 in FIG. 24. As illustrated in FIG. 24, the substrate treating apparatus 1 includes three (a plurality of) treating blocks 201 to 203 that perform different predetermined treatments, for example. The three treating blocks 201 to 203 are arranged in line. The three treating blocks 201 to 203 are formed by at least one treating block on a first end side (e.g., two coating blocks 201, 202) and at least one treating block on a second end side (e.g., a developing block 203). The three treating blocks 201 to 203 are formed by a first coating block 201, a second coating block 202, and a developing block 203.

The first coating block 201 performs a first coating treatment to form an antireflection film on the substrate W. The first coating block 201 includes an adhesion enhancing treatment unit PAHP, a cooling unit CP, a coating unit BARC, and a third substrate transport mechanism TM3, for example.

The second coating block 202 performs a second coating treatment to form a resist film on the substrate W. The second coating block 202 includes a heating/cooling unit PHP, a cooling unit CP, a coating unit RESIST, and a third substrate transport mechanism TM3, for example. The developing block 203 performs a developing treatment. The developing block 203 includes a cooling unit CP, a developing unit DEV, a heating/cooling unit PHP, and a third substrate transport mechanism TM3, for example.

The first ID block 2 is connected to the first coating block 201 on a first end of the three treating blocks 201 to 203. The IF block 6 is connected to the developing block 203 on a second end of the three treating blocks 201 to 203. Here, the first coating treatment may be treatment of forming the antireflection film and the resist film. In this case, the second coating treatment may be treatment of forming the resist cover film with repellency, for example.

An operation of the substrate treating apparatus 1 according to this modification will now be described. It is supposed that three treating blocks 201 to 203 each include a single treatment layer.

The first ID block 2 takes a substrate W from a carrier C placed on the platform 13 of either of the two openers 9, 10, and transports the taken substrate W to the two coating blocks 201, 202 on the first end side. The two coating blocks 201, 202 on the first end side perform predetermined treatments (first coating treatment and second coating treatment) to the sent substrate W. Specifically, the first coating block 201 performs the first coating treatment (antireflection film formation) on the substrate W sent from the ID block 2, and sends the substrate W subjected to the first coating treatment to the second coating block 202. The second coating block 202 performs the second coating treatment (resist film formation) on the substrate W sent from the first coating block 201, and sends the substrate W subjected to the second coating treatment to the developing block 203 on the second end side.

The developing block 203 on the second end side sends the substrate W treated by the treating blocks 201, 202 on the first end side to the IF block 6. The IF block 6 unloads the substrate W treated by the treating blocks 201, 202 on the first end side into the exposure device EXP. The IF block 6 loads the substrate W from the exposure device EXP, and transports the substrate W treated in the exposure device EXP to the treating block on the second end side (developing block) 203.

The developing block 203 on the second end side performs a predetermined treatment (developing treatment) to the substrate W sent from the IF block 6. The IF block 6 returns the substrate W treated in the developing block 203 on the second end side to the carrier C placed on the platform 47 of either of the two openers 45, 46.

According to this modification of the present invention, the substrate W is transported from the IF block 6 to the developing block 203 on the second end side in the return path, and thereafter, the substrate W is returned back from the developing block 203 on the second end side to the IF block 6 without being transported to the coating blocks 201, 202 on the first end side. Consequently, transportation process by the coating blocks 201, 202 on the first end side in the return path is reduced so that an entire throughput of the substrate treating apparatus 1 can be enhanced.

Figure 25:
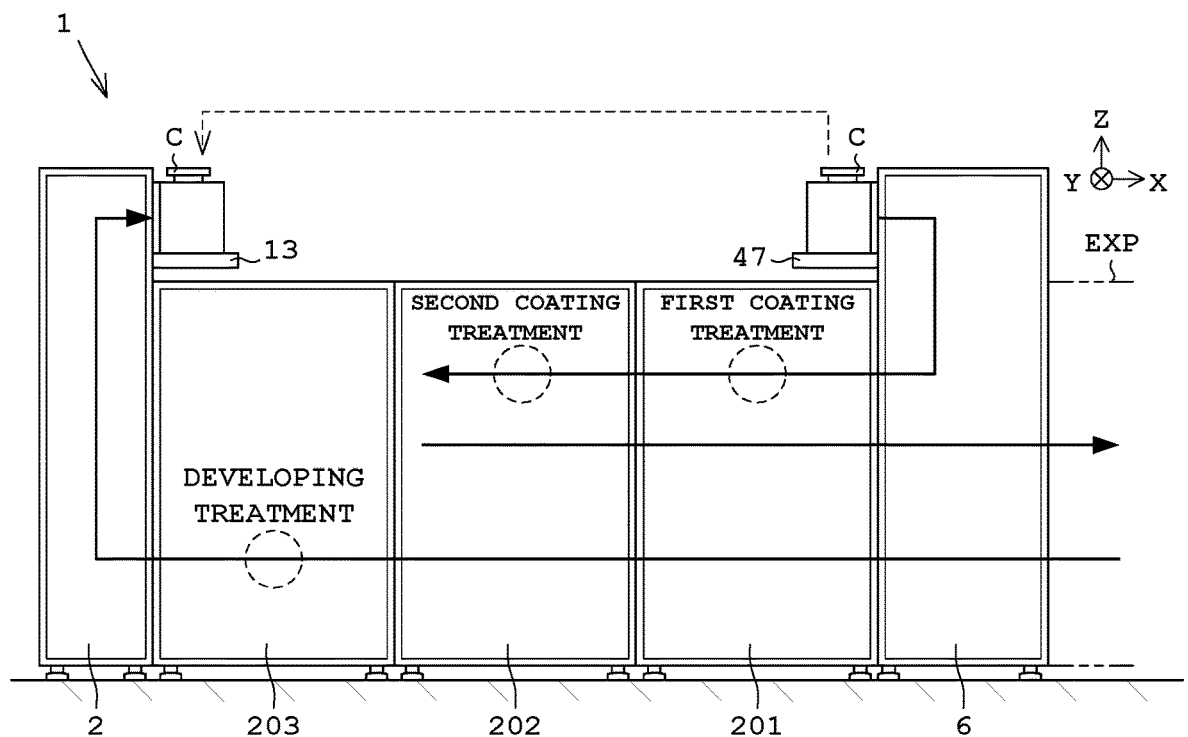
FIG. 25 illustrates a configuration and operation of a substrate treating apparatus according to still another modification of the present invention.

(8) The following describes a substrate treating apparatus 1 in FIG. 25. In the substrate treating apparatus 1 in FIG. 25, the ID block 2, the developing block 203, the second coating block 202, the first coating block 201, and the IF block 6 are arranged in this order.

An operation of the substrate treating apparatus 1 according to this modification will now be described. It is supposed that three treating blocks 201 to 203 each include a single treatment layer.

The IF block 6 takes a substrate W from the carrier C placed on the platform 47, and sends the taken substrate W to the coating blocks 201, 202 on the second end side. The coating blocks 201, 202 on the second end side perform a first coating treatment and a second coating treatment to the substrate W sent from the IF block 6. The IF block 6 unloads the substrate W treated by the coating block 201, 202 on the second end side into the exposure device EXP. The IF block 6 loads the substrate W subjected to the exposure treatment in the exposure device EXP from the exposure device EXP, and transports the substrate W to the coating blocks 201, 202 on the second end side.

The coating blocks 201, 202 on the second end side send the substrate W treated in the exposure device EXP to the developing block 203 on the first end side. The developing block 203 on the first end side performs a predetermined treatment (developing treatment) to the substrate W sent from the coating blocks 201, 202 on the second end side. The ID block 2 returns the substrate W treated in the developing block 203 on the first end side to the carrier C placed on the platform 13.

According to this modification of the present invention, the substrate W is transported from the IF block 6 to the coating blocks 201, 202 on the second end side, and thereafter, the substrate W is returned back from the coating blocks 201, 202 on the second end side to the IF block 6 without being transported to the developing block 203 on the first end side. Consequently, the number of transportation process by the developing block 201 on the first end side in the currently-used forward path from the ID block 2 to the IF block 6 is reduced so that an entire throughput of the substrate treating apparatus 1 can be enhanced.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate, comprising:
    a plurality of treating blocks arranged in line and including at least one treating block on a first end side and at least one treating block on a second end side;
    an indexer block connected to a treating block of the treating blocks on a first end and on which a first carrier platform for placing a carrier capable of accommodating a plurality of substrates thereon is disposed; and
    an interface block connected to a treating block of the treating blocks on a second end and configured to load and unload one substrate into and from an external device, and on which a second carrier platform for placing the carrier thereon is disposed;
    the indexer block taking one substrate from the carrier placed on the first carrier platform and sending the taken substrate to the at least one treating block on the first end side,
    the at least one treating block on the first end side performing a predetermined treatment to the sent substrate,
    the at least one treating block on the second end side sending the substrate treated in the at least one treating block on the first end side to the interface block,
    the interface block unloading the substrate treated in the at least one treating block on the first end side into the external device,
    the interface block loading the substrate from the external device and sending the substrate treated in the external device to the at least one treating block on the second end side,
    the at least one treating block on the second end side performing a predetermined treatment to the substrate sent from the interface block, and
    the interface block returning the substrate treated in the at least one treating block on the second end side to the carrier placed on the second carrier platform.

2. The substrate treating apparatus according to claim 1, wherein
    the treating blocks include a first treating block configured to perform a first treatment, and a second treating block configured to perform a second treatment,
    the indexer block is connected to the first treating block,
    the interface block is connected to the second treating block,
    the second treating block is connected to the first treating block,
    the indexer block takes the one substrate from the carrier placed on the first carrier platform and sends the taken substrate to the first treating block,
    the first treating block performs the first treatment to the sent substrate, and sends the substrate subjected to the first treatment to the second treating block,
    the second treating block sends the substrate subjected to the first treatment to the interface block,
    the interface block unloads the substrate subjected to the first treatment into the external device,
    the interface block loads the substrate from the external device and sends the substrate subjected to a third treatment in the external device to the second treating block,
    the second treating block performs the second treatment to the substrate sent from the interface, and sends the substrate subjected to the second treatment to the interface block, and
    the interface block returns the substrate treated in the second treating block to the carrier placed on the second carrier platform.

3. The substrate treating apparatus according to claim 1, further comprising:
    a carrier transport mechanism configured to transport the carrier between the first carrier platform and the second carrier platform.

4. The substrate treating apparatus according to claim 3, wherein
    the carrier transport mechanism is mounted on the first treating block and the second treating block.

5. The substrate treating apparatus according to claim 3, further comprising:
    a carrier storage shelf mounted on at least either the first treating block or the second treating block, and
    the carrier transport mechanism transports the carrier among the first carrier platform, the second carrier platform, and the carrier storage shelf.

6. A substrate treating apparatus for treating a substrate, comprising:
    a plurality of treating blocks arranged in line and including at least one treating block on a first end side and at least one treating block on a second end side;
    an indexer block connected to a treating block of the treating blocks on a first end and on which a first carrier platform for placing carrier capable of accommodating a plurality of substrates thereon is disposed; and
    an interface block connected to a treating block of the treating blocks on a second end and configured to load and unload one substrate into and from an external device, and on which a second carrier platform for placing the carrier thereon is disposed;
    the interface block taking one substrate from the carrier placed on the second carrier platform and sending the taken substrate to the at least one treating block on the second end side, the at least one treating block on the second end side performing a predetermined treatment to the substrate sent from the interface block, the interface block unloading the substrate treated in the at least one treating block on the second end side into the external device, the interface block loading the substrate from the external device and sending the substrate treated in the external device to the at least one treating block on the second end side, the at least one treating block on the second end side sending the substrate treated in the external device to the at least one treating block on the first end side, the at least one treating block on the first end side performing a predetermined treatment to the substrate sent from the at least one treating block on the second end side, and the indexer block returning back the substrate treated in the at least one treating block on the first end side to the carrier placed on the first carrier platform.

7. The substrate treating apparatus according to claim 6, wherein the treating blocks include a first treating block configured to perform a first treatment, and a second treating block configured to perform a second treatment, the indexer block is connected to the first treating block, the interface block is connected to the second treating block, the second treating block is connected to the first treating block, the interface block takes the substrate from the carrier placed on the second carrier platform and sends the taken substrate to the second treating block, the second treating block performs the second treatment to the substrate sent from the interface block, the interface block unloads the substrate subjected to the second treatment into the external device, the interface block loads the substrate from the external device and sends the substrate subjected to a third treatment in the external device to the second treating block, the second treating block sends the substrate subjected to the third treatment to the first treating block, the first treating block performs the first treatment to the substrate sent from the second treating block, and the indexer block returns the substrate subjected to the first treatment to the carrier placed on the first carrier platform.

8. The substrate treating apparatus according to claim 7, wherein the interface block includes a treating unit configured to perform a fourth treatment and a substrate transport mechanism, and the substrate transport mechanism sends one substrate at least among the second treating block, the carrier placed on the second carrier platform, and the treating unit.

9. The substrate treating apparatus according to claim 7, wherein the interface block includes a second indexer block connected to the second treating block and on which the second carrier platform is disposed, and an IF body block connected to the second indexer block and configured to load and unload one substrate into and from the external device, the second indexer block includes a first substrate transport mechanism configured to send one substrate among the second treating block, the carrier placed on the second carrier platform, and the IF body block, and the IF body block includes a treating unit configured to perform a fourth treatment and a second substrate transport mechanism, the second substrate transport mechanism sending one substrate at least between the second indexer block and the treating unit.

10. A substrate transporting method used by a substrate treating apparatus including: a plurality of treating blocks arranged in line and including at least one treating block on a first end side and at least one treating block on a second end side;

an indexer block connected to a treating block of the treating blocks on a first end and on which a first carrier platform for placing carrier capable of accommodating a plurality of substrates thereon is disposed;

an interface block connected to a treating block of the treating blocks on a second end and configured to load and unload a substrate into and from an external device; the substrate transporting method comprising:

a taking and sending step of causing the indexer block to take the substrate from the carrier placed on the first carrier platform and to send the taken substrate to the at least one treating block on the first end side;

a first treating step of causing the at least one treating block on the first end side to perform a predetermined treatment to the sent substrate;

a first sending step of causing the at least one treating block on the second end side to send the substrate treated in the at least one treating block on the first end side to the interface block;

an unloading step of causing the interface block to unload the substrate treated in the at least one treating block on the first end side into the external device;

a loading and sending step of causing the interface block to load the substrate from the external device and to send the substrate treated in the external device to the at least one treating block on the second end side;

a second treating step of causing the at least one treating block on the second end side to perform a predetermined treatment to the substrate sent from the interface block; and a returning step of causing the interface block to return the substrate treated in the at least one treating block on the second end side into the carrier placed on a second carrier platform provided in the interface block.

11. A substrate transporting method used by a substrate treating apparatus including: a plurality of treating blocks arranged in line and including at least one treating block on a first end side and at least one treating block on a second end side;

an indexer block connected to a treating block of the treating blocks on a first end and on which a first carrier platform for placing a carrier capable of accommodating a plurality of substrates thereon is disposed;

an interface block connected to a treating block of the treating blocks on a second end and configured to load and unload one substrate into and from an external device; the substrate transporting method comprising:

a taking and sending step of causing the interface block to take one substrate from the carrier placed on a second carrier platform in the interface block and to send the taken substrate to the at least one treating block on the second end side, a first treating step of causing the at least one treating block on the second end side to perform a predetermined treatment to the substrate sent from the interface block;

an unloading step of causing the interface block to unload the substrate treated in the at least one treating block on the second end side into the external device;

a loading and sending step of causing the interface block to load the substrate from the external device and to send the substrate treated in the external device to the at least one treating block on the second end side;

a sending step of causing the at least one treating block on the second end side to send the substrate treated in the external device to the at least one treating block on the first end side;

a second treating step of causing the at least one treating block on the first end side to perform a predetermined treatment to the substrate sent from the at least one treating block on the second end side; and a returning step of causing the indexer block to return back the substrate treated in the at least one treating block on the first end side to the carrier placed on the first carrier platform.

* * * * *